United States Patent
Shukla et al.

(10) Patent No.: US 10,374,178 B2
(45) Date of Patent: Aug. 6, 2019

(54) METHOD FOR MAKING DEVICES HAVING DIELECTRIC LAYERS WITH THIOSULFATE-CONTAINING POLYMERS

(71) Applicant: Eastman Kodak Company, Rochester, NY (US)

(72) Inventors: Deepak Shukla, Webster, NY (US); Kevin M. Donovan, Bergen, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 226 days.

(21) Appl. No.: 15/488,572

(22) Filed: Apr. 17, 2017

(65) Prior Publication Data
US 2017/0222167 A1 Aug. 3, 2017

Related U.S. Application Data

(62) Division of application No. 14/301,370, filed on Jun. 11, 2014, now Pat. No. 9,691,997.

(51) Int. Cl.
*C01B 17/64* (2006.01)
*C08F 12/30* (2006.01)
(Continued)

(52) U.S. Cl.
CPC .......... *H01L 51/0545* (2013.01); *C01B 17/64* (2013.01); *C08F 12/30* (2013.01);
(Continued)

(58) Field of Classification Search
None
See application file for complete search history.

(56) References Cited

U.S. PATENT DOCUMENTS

| 5,071,641 A | 12/1991 | Lewis |
| 5,424,062 A | 6/1995 | Schwan |

(Continued)

FOREIGN PATENT DOCUMENTS

| WO | 2014/150121 A1 | 9/2014 |
| WO | 2014/153331 A1 | 9/2014 |

OTHER PUBLICATIONS

Jer-Wei Chang, et al., "chicken albumen dielectrics in organic field-effect transistors," Adv. Mater. 2011, 23, 4077-4081.

*Primary Examiner* — Nicole M. Buie-Hatcher
(74) *Attorney, Agent, or Firm* — J. Lanny Tucker

(57) ABSTRACT

A semiconductor device can be prepared using a precursor dielectric composition that comprises: (1) a photochemically or thermally crosslinked product of a photocurable or thermally curable thiosulfate-containing polymer that has a $T_g$ of at least 50° C. and that comprises: an organic polymer backbone comprising (a) recurring units comprising pendant thiosulfate groups; and further comprises charge balancing cations, and (2) optionally, an electron-accepting photo sensitizer component. The electronic device can be prepared by independently applying the precursor dielectric composition and an organic semiconductor composition to a substrate to form an applied precursor dielectric composition and an applied organic semiconductor composition, respectively, and subjecting the applied precursor dielectric composition to curing conditions to form a gate dielectric layer that is in physical contact with the applied organic semiconductor composition.

19 Claims, 2 Drawing Sheets

(51) Int. Cl.
  *C08G 18/08*   (2006.01)
  *C08G 77/28*   (2006.01)
  *G03F 7/027*   (2006.01)
  *H01L 51/05*   (2006.01)
  *C08F 128/04*  (2006.01)
  *C08G 77/392*  (2006.01)
  *H01L 51/00*   (2006.01)

(52) U.S. Cl.
  CPC ........ *C08F 128/04* (2013.01); *C08G 18/0828* (2013.01); *C08G 77/28* (2013.01); *C08G 77/392* (2013.01); *G03F 7/0275* (2013.01); *H01L 51/052* (2013.01); *H01L 51/0053* (2013.01); *H01L 51/0097* (2013.01); *H01L 51/0537* (2013.01); *H01L 2251/5338* (2013.01)

(56) References Cited

U.S. PATENT DOCUMENTS

| | | |
|---|---|---|
| 5,610,005 A | 3/1997 | Kawakami et al. |
| 5,985,514 A | 11/1999 | Zheng et al. |
| 6,124,425 A | 9/2000 | Nguyen |
| 6,146,812 A | 11/2000 | Leon et al. |
| 6,420,505 B1 | 7/2002 | Blevins et al. |
| 6,465,152 B1 | 10/2002 | DoMinh et al. |
| 6,846,608 B2 | 1/2005 | Zheng et al. |
| 9,453,095 B2 | 9/2016 | Shukla et al. |
| 2002/0197563 A1* | 12/2002 | Zheng ................... B41C 1/1041 430/281.1 |
| 2005/0139108 A1 | 6/2005 | Ray et al. |
| 2008/0161464 A1 | 7/2008 | Marks et al. |
| 2008/0283829 A1 | 11/2008 | Kim et al. |
| 2011/0045056 A1 | 2/2011 | Munro et al. |
| 2011/0210783 A1* | 9/2011 | Tutt ................... H01L 29/66787 327/530 |
| 2014/0287349 A1 | 9/2014 | Shukla et al. |
| 2014/0287364 A1 | 9/2014 | Shukla et al. |
| 2014/0287365 A1 | 9/2014 | Shukla et al. |
| 2014/0287366 A1 | 9/2014 | Shukla et al. |
| 2014/0288253 A1 | 9/2014 | Shukla et al. |
| 2015/0293451 A1* | 10/2015 | Irving ....................... G03F 7/16 430/18 |
| 2015/0318077 A1* | 11/2015 | Koizumi ............... H01L 51/052 257/40 |
| 2015/0361201 A1 | 12/2015 | Shukla et al. |
| 2015/0361206 A1 | 12/2015 | Shukla et al. |
| 2015/0364688 A1 | 12/2015 | Shukla et al. |

* cited by examiner

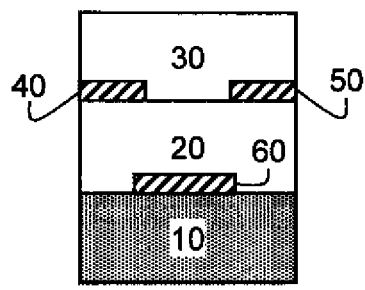
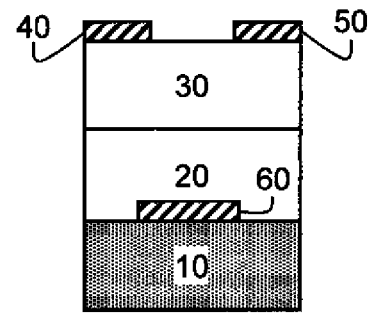
FIG. 1a  FIG. 1b
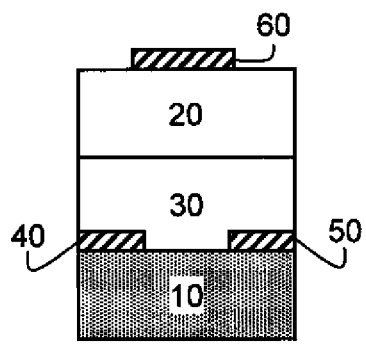
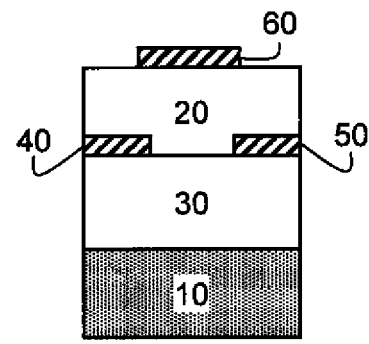
FIG. 1c  FIG. 1d

METHOD FOR MAKING DEVICES HAVING DIELECTRIC LAYERS WITH THIOSULFATE-CONTAINING POLYMERS

RELATED APPLICATIONS

This is a divisional of application Ser. No. 14/301,370, filed Jun. 11, 2014, by Shukla and Donovan, now allowed.

Reference is made to the following commonly assigned patent applications, the disclosures of which are incorporated herein by reference:

U.S. Pat. No. 9,453,095, issued Sep. 27, 2016, to Shukla and Donovan, and entitled "Photocurable and Thermally Curable Thiosulfate-containing Polymers";

U.S. Publication Number 2015/0361206, published on Dec. 17, 2015 (now allowed), by Shukla, Mis, and Donovan, and entitled "Thiosulfate-containing Polymers Associated with Photosensitizer Component"; and U.S. Publication Number 2015/0364688, published on Dec. 17, 2015 (now allowed), by Shukla, Donovan, and Mis, and entitled "Precursor Dielectric Composition with Thiosulfate-Containing Polymers."

FIELD OF THE INVENTION

This invention relates to various devices such as organic field effect transistors (OFET's) containing crosslinked disulfide polymers derived from unique photocurable or thermally curable thiosulfate-containing polymers that comprise neutralizing organic cations. The crosslinked disulfide polymers provide dielectric materials or gate dielectric in the devices. It also relates to a method for making these making these devices containing the unique photocurable or thermally curable thiosulfate polymers.

BACKGROUND OF THE INVENTION

A typical field effect transistor (FET) comprises a number of layers and they can be configured in various ways. For example, an FET may comprise a substrate, a dielectric, a semiconductor, source and drain electrodes connected to the semiconductor and a gate electrode. When voltage is applied between the gate and source electrodes, charge carriers are accumulated in the semiconductor layer at its interface with the dielectric resulting in the formation of a conductive channel between the source and the drain and current flows between the source and the drain electrode upon application of potential to the drain electrode.

FET's are widely used as a switching element in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. Presently, most thin film devices are made using amorphous silicon as the semiconductor. Amorphous silicon is a less expensive alternative to crystalline silicon. This fact is especially important for reducing the cost of transistors in large-area applications. Application of amorphous silicon is limited to low speed devices, however, since its maximum mobility (0.5-1.0 cm$^2$/V·sec) is about a thousand times smaller than that of crystalline silicon.

Although amorphous silicon is less expensive than highly crystalline silicon for use in TFT's, amorphous silicon still has its drawbacks. The deposition of amorphous silicon, during the manufacture of transistors, requires relatively costly processes, such as plasma enhanced chemical vapor deposition and high temperatures (about 360° C.) to achieve the electrical characteristics sufficient for display applications. Such high processing temperatures disallow the use of substrates, for deposition, made of certain plastics that might otherwise be desirable for use in applications such as flexible displays.

In the past two decades, organic materials have received significant attention as a potential alternative to inorganic materials, such as amorphous silicon, for use in semiconductor channels of FET's. Compared to inorganic materials, that require a high-temperature vacuum process, organic semiconductor materials are simpler to process, especially those that are soluble in organic solvents and, therefore, capable of being applied to large areas by far less expensive processes, such as roll-to-roll coating, spin coating, dip coating and micro-contact printing. Furthermore, organic materials may be deposited at lower temperatures, opening up a wider range of substrate materials, including plastics, for flexible electronic devices. Accordingly, thin film transistors made of organic materials can be viewed as a potential key technology for plastic circuitry in display drivers, portable computers, pagers, memory elements in transaction cards, and identification tags, where ease of fabrication, mechanical flexibility, and/or moderate operating temperatures are important considerations. However, to realize these goals, OFET semiconductor and dielectric components should ideally be easily manufactured using high-throughput, atmospheric pressure, solution-processing methods such as spin-coating, casting, or printing.

To date in the development of organic field effect transistors (OFET's) considerable efforts have been made to discover new organic semiconductor materials and optimizing properties of such materials. These efforts have been quite fruitful and a number of organic semiconducting materials have been designed and, to a lesser extent, structure-property relationships of such materials have been studied.

Accordingly, fused acenes such as tetracene and pentacene, oligomeric materials containing thiophene or fluorene units, and polymeric materials like regioregular poly(3-alkylthiophene) have been shown to perform in OFET's as "p-type" or "p-channel," semiconductors, meaning that negative gate voltages, relative to the source voltage, are applied to induce positive charges (holes) in the channel region of the device. Examples of acene and heteroacenes based semiconductors are well known in the prior art.

As an alternative to p-type organic semiconductor materials, n-type organic semiconductor materials can be used in FET's where the terminology "n-type" or "n-channel" indicates that positive gate voltages, relative to the source voltage, are applied to induce negative charges in the channel region of the device. For example, n-type semiconductors based on diimide materials are known in the art.

The overall performance of an OFET is dependent on a number of factors such as the degree of crystallization and order of organic semiconductor layer, charge characteristics, and trap density at the interfaces between dielectric and organic semiconductor layers, and the carrier injection ability of the interfaces between source/drain electrodes and organic semiconductor layers. Although, the gate dielectric layer is intended to ensure a sufficiently good electrical insulation between the semiconductor and the gate electrode, it plays an important role in the overall performance of an OFET. In particular, the gate dielectric permits the creation of the gate field and the establishment of the two-dimensional channel charge sheet. Upon application of a source-drain bias, the accumulated charges move very close to the dielectric-semiconductor interface from the source electrode to the drain electrode.

Since the charge flow in organic semiconductor occurs very close (~1 nm) to the dielectric interface, it is important to optimize chemical and electrical behavior of the dielectric layer. Besides these factors, the dielectric surface morphology has a great effect on carrier or charge mobility of the semiconductor. The surface morphology of the dielectric material and variations in its surface energies [for example, surface treatment via self-assembled monolayers (SAMs)] have been shown to modify the growth, morphology, and microstructure of the vapor/solution-deposited semiconductor, each of these being a factor affecting mobility and current on/off ratio, the latter being the drain-source current ratio between the "on" and "off" states, another important device parameter. The properties of the dielectric material can also affect the density of state distribution for both amorphous and single-crystal semiconductors.

Gate dielectric materials for OFET's can be divided into inorganic and organic materials. Inorganic dielectric materials like silicon oxide ($SiO_2$), silicon nitride ($SiN_x$), aluminum oxide ($AlO_x$), and tantalum oxide ($TaO_x$) are conventionally deposited via chemical vapor deposition (CVD) and plasma enhanced CVD methods which are high temperatures (>300° C.) processes and not compatible with polymeric substrates. Lower processing temperatures usually lead to poor quality films with pinholes, resulting in poor insulating properties. As a result, it is necessary to use thick layers (more than 100 nm) to ensure sufficiently good insulator properties which results in increased supply voltages for operation of such circuits. Another widely used process is ion beam deposition, but it needs high vacuum and expensive equipment that are incompatible with the goal of very low cost production. Similarly, use of other high dielectric constant inorganic materials as barium zirconate titanate (BZT) and barium strontium titanate (BST) need either a high firing temperature (400° C.) for the sol-gel process, or radiofrequency magnetron sputtering, which also requires vacuum equipment, and can also have stoichiometric problems.

In addition to higher temperature processing, inorganic insulating layers generally require interfacial modification before they can be used with an organic semiconductor. It has been shown that the presence of polar functionalities (like —OH groups on $SiO_2$ surface) at the dielectric-organic semiconductor interface trap charges which results in lowers carrier mobility in organic semiconductors. This is especially true for n-type organic semiconductors and OFET devices comprising n-type semiconductors. For example, a silicon dioxide dielectric surface is commonly functionalized with long alkyl chain silanes [commonly octadodecyl trichlorosilane (OTS)] using a solution phase self-assembly process. This results in a low energy dielectric surface with very few chemical defects or reactive functionalities that could adversely affect the OFET device performance.

Most organic materials used in OFET's cannot withstand the high processing temperatures used with conventional inorganic materials. For example, the 200° C. or higher temperatures needed to process conventional inorganic materials would at the very least cause a polymeric substrate to deform, and might cause further breakdown of the polymer or even ignition at high enough temperatures. Deformation is highly undesirable, since each layer of the structure has to be carefully registered with the layers below it, which becomes difficult to impossible when the layers below it are deformed due to processing temperatures.

As an alternative to inorganic gate dielectrics, insulating polymers have been proposed for fabrication of OFET's. Polymers generally have the advantage that they can be processed at relatively low temperatures below 200° C. However, compared to inorganic dielectrics, the insulating property of thin layers of polymeric dielectrics is usually poor on account of leakage currents. Hence, comparatively thick layers (more than 100 nm) of polymeric dielectrics are usually employed in fabrication of OFET's. As a consequence, integrated circuits having OFET's with polymeric gate dielectrics require the use of comparatively high supply voltages. In pentacene layers deposited on polymeric dielectrics, the mobility of the charge carriers is similar or higher in comparison with inorganic dielectrics.

A number of polymers have been used as gate dielectrics in OFET's. Halik et al. (*Journal of Applied Physics* 93, 2977 (2003)) describe the use of poly(vinyl phenol) (PVP) that is thermally cross-linked with polymelamine-co-formaldehyde as a gate dielectric layer to make p-type OFET's. However, this attempt is limited in usefulness since a high temperature of about 200° C. is required to attain crosslinking. Similarly, U.S. Patent Application Publication 2010-0084636 (Lin et al.) describes a photosensitive dielectric material comprising a poly(vinyl phenol) based polymer, a crosslinking agent, and a photoacid generator. However, the presence of acid is not desirable since it could have deleterious effect on the performance of OFET's.

U.S. Pat. No. 7,298,023 (Guillet et al.) describes the use of organic insulator (or dielectric) comprising a base copolymer of PVDC-PAN-PMMA having the general formula $(-CH_2Cl_2-)_x-(-CH_2CH(CN)-)_y-(CH_2C(CH_3)(CO_2CH_3))_z$, wherein x, y, z, in each case (independently from one another) can assume values between 0 and 1, for use in OFET's and organic capacitors. However, the presence of polar groups at the dielectric interface creates dipolar disorder that lowers the carrier mobility.

U.S. Patent Application Publication 2008-0283829 (Kim et al.) discloses an organic insulator composition comprising a crosslinking agent and a hydroxyl group-containing oligomer or hydroxyl group-containing polymer. However, the presence of hydroxyl groups at the organic semiconductor gate dielectric interface is not desirable as hydroxyl trap charges.

U.S. Pat. No. 6,232,157 (Dodabalapur et al.) discloses the use of a polyimide as material for organic insulating films. U.S. Pat. No. 7,482,625 (Kim et al.) discloses a thermosetting composition for organic polymeric gate insulating layer in OFET's. U.S. Pat. No. 7,482,625 also describes blending polyvinyl phenol with another polymer in consideration of physical, chemical, and electrical characteristics. The polymers that can be blended include polyacrylates, poly(vinyl alcohol), polyepoxys, polystyrene, and poly(vinyl pyrrolidone). U.S. Pat. No. 7,741,635 (Kim et al.) describes photocrosslinkable polymer dielectric composition comprising an insulating organic polymer such as poly(methyl methacrylate) (PMMA), poly(vinyl alcohol) (PVA), poly(vinyl pyrrolidone) (PVP), or poly(vinyl phenol) (PVPh) and a copolymer thereof, a crosslinking monomer having two or more double bonds, and a photoinitiator. U.S. Patent Application Publication 2008-0161464 (Marks et al.) discloses a crosslinked polymeric composition as gate dielectric material.

EP 1,679,754A1 (Kim et al.) describes coating a surface of a crosslinked poly(vinyl phenol) gate dielectric with a thin film of fluorine containing polymer. Although OFET device performance may improve in the presence of fluorine containing polymer, the process requires undesirably coating multiple polymer layers. U.S. Pat. No. 7,352,038 (Kelley et al.) describes an OFET comprising a substantially non-fluorinated polymeric layer interposed between a gate dielectric and an organic semiconductor layer.

U.S. Pat. No. 7,528,448 (Bailey et al.) describes a multilayer thermal imaging dielectric donor composition of a dielectric layer comprising one or more dielectric polymers such as acrylic and styrenic polymers and heteroatom-substituted styrenic polymers.

WO2007-129832 (Lee et al.) describes a composition for forming a gate insulating layer of an OFET comprising an acrylate polymer and show mobilities in the range of 0.19-0.25 $cm^2/V \cdot sec$, which are significantly lower than those reported for poly(methyl methacrylate) dielectric compositions.

While a number of dielectric compositions and materials have been proposed for uses in OFET devices, polymer dielectric materials that work well in p-type or p-channel OFET's usually do not necessarily perform as well with OFET's comprising n-type semiconductors. It has been proposed that the presence of reactive chemical functionalities and dipoles at the semiconductor-polymer dielectric interface have much more significant effect on n-type semiconductors than p-type semiconductors. U.S. Pat. No. 7,638,793 (Chua et al.) describes that for an n-channel or ambipolar OFET the organic gate dielectric layer forming an interface with the semiconductive layer; should have less than $10^{18}$ $cm^{-3}$ bulk concentration of trapping groups, and the use of poly(siloxanes) (for example Cyclotene® electrical polymer), poly(alkenes), and poly(oxyalkylenes) as dielectric materials.

Although various polymer dielectric compositions are known, a number of problems still remain in terms of the process of making such dielectric layers and improving overall performance in OFET's. As discussed before, some the polymer dielectric compositions require coating of multiple layers that is a difficult and costly process. Other examples of dielectric compositions include thermosetting polymers comprising poly(vinyl phenol) as the main component and require a high temperature annealing and crosslinking process. It is difficult to crosslink all phenolic groups during thermal annealing and thus the presence of phenolic groups in dielectric is not desirable.

Furthermore, most polymer materials are usually not appropriate for use in low voltage applications due to their low dielectric constant (k). There have been many attempts to obtain a high capacitance with gate dielectrics by reducing their thickness or using polymer-inorganic composites to increase the dielectric constant (k) to produce low voltage operating OFET's.

For example, Japanese Patent 3,515,507 (Aoki et al.) discloses an organic polymer and an inorganic material that are mixed to provide insulating film with flexibility and high dielectric constant. In accordance with this reference, a powder obtained by mechanically grinding a ferroelectric material such as barium titanate is dispersed in an organic polymer to compensate the dielectric constant of the resulting insulated gate film and hence lower the gate voltage required for the operation of OFET. However, when this method is used, the thickness of the insulating film is limited to the size of the inorganic material thus ground. Furthermore, since a solid material is dispersed in an organic polymer solution, an uneven dispersion is formed, possibly causing the generation of local electric field and concurrent dielectric breakdown during the operation of transistor. Importantly, since the inorganic material is merely present in the organic polymer and thus does not compensate the chemical resistance of the insulating film, the resulting insulating film cannot be subjected to any processes involving the use of solvents.

Japanese Patent Publication 2003-338551 (Shindo) discloses a technique of forming a thin ceramic film as an insulating film on the surface of silicon wafer by a sol-gel method allowing a low temperature treatment. The resulting thin ceramic film can be prevented from being cracked, making it possible to efficiently produce electronic parts having a high reliability. However, the thin ceramic film is an insulating film made of an inorganic material that can be applied to silicon wafer, which is nonflexible and hard, but it cannot be applied to flexible substrates.

U.S. Patent Application 2010-0230662 (Chen et al.) discloses gate insulating layer comprising an azole-metal complex compound. However, pentacene based OFET having an azole-metal complex compound as a dielectric shows lower mobility and poor current on/off ratio.

U.S. Patent Application 2010-0051917 (Kippelen et al.) discloses embodiments of OFET's having a gate insulator layer comprising organic polymer, specifically poly(vinyl phenol) (PVP), nanocomposites incorporating metal oxide nanoparticles (for example, barium titanate ($BaTiO_3$), strontium titanate ($SrTiO_3$), and barium zirconium titanate ($BaZrTiO_3$)) coated by organic ligands and methods of fabricating such OFET's.

Usually dispersions of metal oxide nanoparticles in a polymer matrix are not homogeneous. In an attempt to obtain a uniformly dispersed organic-inorganic mixture system as an ordinary material technique, it has been practiced to prepare a composite film from a mixture of a solution of metal alkoxide that is a precursor of inorganic oxide and an organic polymer solution by a sol-gel method. In this case, it is expected that as the dispersion of organic polymer is made more on monomolecular level, the thermal stability of the organic polymer is more enhanced. Thus, when a polymer or molecules capable of making hydrogen bond such as hydroxyl group or electrostatic mutual action are present in a metal alkoxide solution, a sol-gel polycondensation is formed selectively on the surface of the compound to form a dried gel.

A composite film comprised of poly(methyl methacrylate-co-methacrylic acid) (PMMA-co-MAA)/sol-gel-derived $TiO_2$ has been used as gate dielectric layer in pentacene based OFET's. However, surface roughness of such films is quite high (about 2.1 nm). In the case of deposition of small semiconductor molecules, such as pentacene, molecular orientation and grain morphology depend strongly on the surface roughness and energy of the underlying film. Surface smoothness of poly(4-vinylphenol)-composite is better (about 1.3 nm) and pentacene OFETs show smaller threshold voltage (Kim et al. *J. Am. Chem. Soc.* 132, 14721, 2010).

Although various polymer dielectric compositions are known, a number of problems still remain in terms of the process of making such dielectric layers and improving overall performance in OFET's. As discussed before, to increase the dielectric constant of polymer dielectric materials, a number of polymer-inorganic composites, by adding metal oxide nanoparticles and making metal oxide nanoparticles by sol-gel method, are known. However, these methods do not result in crosslinking of the dielectric layer, which is a key requirement in solution processable OFET's. To achieve crosslinking photocurable resins have to be used.

Since most of the polymer dielectrics known in prior art are not crosslinked, the resulting dielectric film cannot be subjected to any processes involving the use of solvents. To address this problem various cross linked polymer dielectrics have been developed for example as described by Halik et al. [*Journal of Applied Physics* 93, 2977 (2003)]. In addition, U.S. Pat. No. 7,482,625 (Kim et al.) describes blending polyvinyl phenol with another polymer for certain physical, chemical and electrical characteristics. However, this approach has limited application since a high temperature of about 200° C. is required to attain crosslinking.

Thus, there is a need for polymer dielectric materials that are soluble in environmentally friendly solvents, easy to apply as a single layer, that exhibit good electrical and insulating properties, and that can be prepared from commercially available polymer or molecular precursors using solution processes at low temperatures and atmospheric pressures. It is also desired that they have higher dielectric constant (k) and could be thermally and/or photochemically crosslinked. It is difficult to find polymeric materials that have all of these properties because some polymers will exhibit improvements in some of the properties but exhibit worse effects in others.

With the difficulty in balancing all desired properties in mind, there continues to be research to find useful polymeric dielectric materials.

SUMMARY OF THE INVENTION

To address the problems noted above, the present invention provides dielectric materials obtained from precursor dielectric compositions, and associated devices that address various deficiencies in the art.

The present invention therefore provides a device comprising a gate dielectric layer that comprises:

(1) a photochemically or thermally crosslinked product of a photocurable or thermally curable thiosulfate-containing polymer that has a $T_g$ of at least 50° C. and that comprises: an organic polymer backbone comprising (a) recurring units comprising pendant thiosulfate groups; and charge balancing cations, and (2) optionally, an electron-accepting photosensitizer component.

Further, in some device embodiments, the gate dielectric layer comprises a crosslinked disulfide polymer derived from the photocurable or thermally curable thiosulfate-containing polymer provided in a precursor dielectric composition further comprising one or more organic solvents in which the photocurable or thermally curable thiosulfate-containing polymer is dissolved or dispersed.

For example, such devices can be thin film transistors each of which comprises a gate electrode, the gate dielectric layer described above, an organic semiconductor layer, and source and drain electrodes formed on a substrate that is glass substrate, silicon wafer, or a flexible polymeric film.

This invention also comprises a method for preparing an electronic device comprising:

independently applying a precursor dielectric composition and an organic semiconductor composition to a substrate to form an applied precursor dielectric composition and an applied organic semiconductor composition, respectively, and subjecting the applied precursor dielectric composition to curing conditions to form a gate dielectric layer comprising a photochemically cured or thermally cured product of a photocurable or thermally curable thiosulfate-containing polymer, which gate dielectric layer is in physical contact with the applied organic semiconductor composition, wherein the precursor dielectric composition comprises:

(1) the photocurable or thermally curable thiosulfate-containing polymer that has a $T_g$ of at least 50° C. and that comprises: an organic polymer backbone comprising (a) recurring units comprising pendant thiosulfate groups; and charge balancing cations, (2) optionally, an electron-accepting photosensitizer component, and (3) optionally, one or more organic solvents in which the photocurable or thermally curable thiosulfate polymer is dissolved or dispersed.

Such methods can be designed to comprise the features, in order:

applying the precursor dielectric composition to the substrate to form the applied precursor dielectric composition, removing any solvents from the applied precursor dielectric composition, simultaneously or subsequently, curing the applied precursor dielectric composition to form a gate dielectric layer comprising a crosslinked disulfide polymer, applying the organic semiconductor composition to the gate dielectric layer to form the applied organic semiconductor layer, and forming one or more sets of electrically conductive source and drain electrodes on the applied organic semiconductor layer.

Moreover, a process of this invention for fabricating a thin-film semiconductor device of this invention, comprises:
providing a substrate,
providing a gate electrode material over the substrate,
providing a gate dielectric layer over the gate electrode material,
providing a thin film of an organic semiconductor material, and
providing a source electrode and a drain electrode contiguous to the thin-film of the organic semiconductor material,
wherein the dielectric gate layer comprises:

(1) a photochemically or thermally crosslinked product of a photocurable or thermally curable thiosulfate-containing polymer that has a $T_g$ of at least 50° C. and that comprises an organic polymer backbone comprising (a) recurring units comprising pendant thiosulfate groups; and charge balancing cations, and (2) optionally, an electron-accepting photosensitizer component.

The present invention provides photocurable or thermally curable thiosulfate-containing polymers and corresponding precursor dielectric compositions, methods to photochemically or thermally crosslink (cure) such thiosulfate-containing polymers in the precursor dielectric compositions (usually in the form of layers), and associated semiconductor devices that address various deficiencies and shortcomings in organic polymers used as dielectric layers in the art. The present invention provides materials and methods for improving the properties of organic field effect transistors (OFET's) including n-type or p-type organic field effect thin film transistors, using improved organic film-forming polymeric precursor dielectric materials. The resulting devices of this invention can be readily manufactured using low-cost processes.

Thus, in some embodiments, the present invention provides dielectric materials within various devices, which dielectric materials contain thermally or photochemically crosslinked products of photocurable or thermally curable thiosulfate-containing polymers. Also provided by the present invention are various precursor dielectric compositions, composites and articles of manufacture (for example, electronic devices) that incorporate the precursor dielectric materials and resulting cured dielectric materials disclosed herein. Examples of electronic devices that can incorporate one or more dielectric materials of the present invention include, but are not limited to, organic thin film transistors (OTFTs), organic field effect transistors (OFETs), and capacitors. In addition to a dielectric component, these devices can include, for example, a substrate component, a semiconductor component, or one or more metallic contact components.

In some embodiments, the present invention provides various methods for preparing the useful photocurable or thermally curable thiosulfate-containing polymers as well as the devices into which they are incorporated. These methods can include applying a precursor dielectric composition onto a substrate, and thermally curing the precursor dielectric composition to provide a dielectric material. Dielectric composition application can be performed by, for example, spin-coating, blade coating, printing, spraying, gravure printing, and flexographic printing. Thermal curing can include heating at a temperature of at least 125° C. and up to and including 150° C.

BRIEF DESCRIPTION OF THE DRAWINGS

FIGS. 1a through 1d illustrate cross-sectional views of four possible configurations for an organic field effect transistor according to at least one embodiment of the present invention. FIGS. 1a and 1b illustrate a device having a bottom gate configuration and FIGS. 1c and 1d illustrate a device having a top gate configuration.

DETAILED DESCRIPTION OF THE INVENTION

Figure 2:
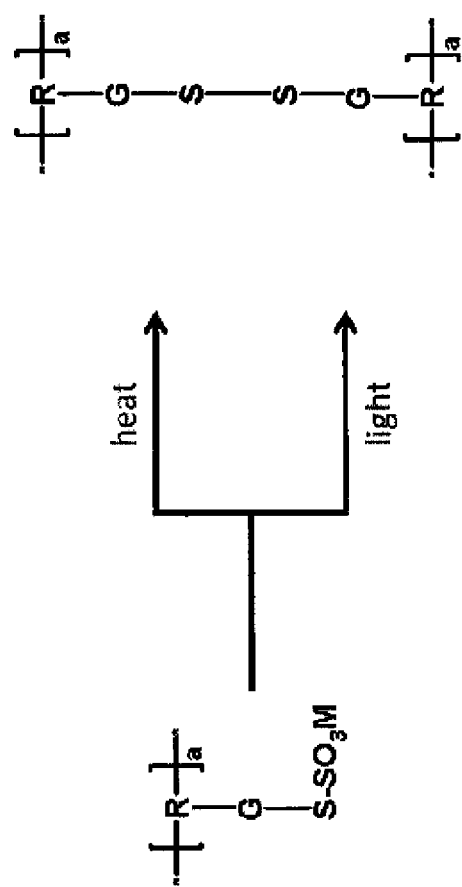
FIG. 2 illustrates general crosslinking or curing schemes.

The following discussion is directed to various embodiments of the present invention and while some embodiments can be desirable for specific uses, the disclosed embodiments should not be interpreted or otherwise considered to limit the scope of the present invention. In addition, one skilled in the art will understand that the following disclosure has broader application than is explicitly described and the discussion of any embodiment is not intended to limit the scope of the present invention.

Definitions

As used herein to define various components of the precursor dielectric compositions, gate dielectric layers, semiconductor thin films, and other formulations, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

As used herein, the terms "over," "above," and "under" and other similar terms, with respect to layers in the devices of this invention, refer to the order of the layers, wherein the organic thin film layer is above the gate electrode, but do not necessarily indicate that the layers are immediately adjacent or that there are no intermediate layers.

Moreover, unless otherwise indicated, percentages refer to percents by total dry weight, for example, weight % based on total solids of either a layer or formulation used to make a layer. Unless otherwise indicated, the percentages can be the same for either the dry layer or the total solids of the formulation used to make that layer.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that comprise two or more different recurring units, and for vinyl polymers can be derived from two or more ethylenically unsaturated polymerizable monomers.

Unless otherwise indicated, the term "mol %" when used in reference to recurring units in polymers, refers to either the nominal (theoretical) amount of a recurring unit based on the molecular weight of ethylenically unsaturated polymerizable monomer used in the polymerization process, or to the actual amount of recurring unit in the resulting polymer as determined using suitable analytical techniques and equipment.

The term "organic backbone" refers to the chain of atoms (carbon or heteroatoms) in a polymer to which a plurality of pendant groups, including thiosulfate groups, can be attached. One example of such a backbone is an "all carbon" backbone obtained from the polymerization of one or more ethylenically unsaturated polymerizable monomers. However, other backbones can include heteroatoms wherein the polymer is formed by a condensation reaction or by some other means.

The term "recurring unit" refers to a distinct unit or segment in a polymer, which can be the same or different as other distinct units, and which recurring units can be derived or created in the polymer using known techniques. Recurring units are generally present in multiple places along the organic polymer backbone and can occur randomly or in blocks.

A "thiosulfate" group is a substituent defined by the following Structure (TS):

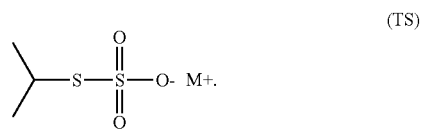

(TS)

Any polymer comprising this thiosulfate group in pendant groups is called a "thiosulfate polymer" or "thiosulfate-containing polymer" in the description of the present invention. When the thiosulfate group is associated with a charge balancing cation (M⁺), the resulting material is considered a Bunte salt.

The term "photocurable or thermally curable thiosulfate-containing polymer" refers to the polymers described below that are useful in the practice of this invention and comprise one or more pendant thiosulfate groups connected to a suitable polymer backbone.

Unless otherwise indicated, the term "crosslinked disulfide polymer" refers to the materials that result from photocuring or thermally curing the photocurable or thermally curable thiosulfate-containing polymers described below. In general, such crosslinked disulfide polymers or the "photochemically or thermally crosslinked product" described herein comprises less than 10 mol % of the original pendant thiosulfate groups that are not crosslinked, or more typically less than 2 mol % of such original pendant thiosulfate groups that are not crosslinked.

Unless otherwise indicated, the terms "dielectric layer" and "gate dielectric layer" are intended to mean the same thing.

The above described features and advantages of the present invention will become more apparent when taken in conjunction with the following description and drawings wherein identical reference numerals have been used, where possible, to designate identical or analogous features that are common to the Figures.

Photocurable or Thermally Curable Thiosulfate-Containing Polymers

The photocurable or thermally curable thiosulfate polymers useful in this invention comprise (a) recurring units comprising pendant thiosulfate groups suitable to provide sufficient disulfide bonds upon crosslinking. These photocurable or thermally curable thiosulfate-containing polymers can be formed from a precursor polymer that has precursor pendant thiosulfate groups (described below) that can be suitably reacted to provide the essential pendant thiosulfate groups attached to polymer backbone. In some embodiments, the photocurable or thermally curable thiosulfate-containing polymer comprises (a) recurring units in an amount of at least 0.5 mol % and up to and including 50 mol %, based on the total recurring units in the photocurable or thermally curable thiosulfate-containing polymer. Other useful embodiments are described in more detail below.

In all embodiments of the photocurable or thermally curable thiosulfate-containing polymers useful in the present invention generally have multiple (two or more) pendant thiosulfate groups (—S—SO₃M groups) distributed randomly or in blocks of recurring units along the chain of atoms forming the organic polymer backbone.

In some embodiments, the photocurable or thermally curable thiosulfate-containing polymers have charge balancing cations that form binary salts with the pending thiosulfate groups in the (a) recurring units. For example, such embodiments can be represented by recurring units represented by the following Structure (I):

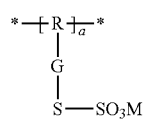
(I)

wherein R represents a suitable organic polymer backbone. Useful polymers that comprise the R organic polymer backbone are described in more detail below. For example, the useful polymers can be formed as vinyl polymers having entirely carbon atoms in the organic polymer backbone, and which contain one or more different recurring units derived from one or more ethylenically unsaturated polymerizable monomers using emulsion or suspension polymerization techniques. Alternatively, the R organic polymer backbone can have carbon, oxygen, sulfur, or nitrogen atoms and be formed from condensation reactions using appropriate reactive compounds (for example diols with diacids to form polyester or diamines with diols to form polyamides). For example, the R organic polymer backbone can be a polyurethane backbone.

In Structure (I), G is a single bond or a suitable divalent linking group that is attached to a polymer backbone. Useful G divalent linking groups include but are not limited to, —(COO)$_p$—(Z)$_q$— wherein p and q are independently 0 or 1. Z can be a substituted or unsubstituted divalent aliphatic group having 1 to 6 carbon atoms including alkylene groups (such as methylene, ethylene, n-propylene, isopropylene, butylenes, 2-hydroxypropylene and 2-hydroxy-4-azahexylene), which divalent aliphatic group can comprise one or more oxygen, nitrogen or sulfur atoms in the chain (such as carbonamido, sulfonamido, alkylenecarbonyloxy, ureylene, carbonyloxy, sulfonyloxy, oxy, dioxy, thio, dithio, seleno, sulfonyl, sulfonyl, and imido), a substituted or unsubstituted arylene group having 6 to 14 carbon atoms in the aromatic ring (such as phenylene, naphthalene, anthracylene, and xylylene), a substituted or unsubstituted combination of alkylene and arylene groups such as substituted or unsubstituted arylenealkylene or alkylenearylene groups having at least 7 and to and including 20 carbon atoms in the chain (such as p-methylenephenylene, phenylenemethylenephenylene, biphenylene, and phenyleneisopropylene-phenylene), or a heterocyclic ring (such as pyridinylene, quinolinylene, thiazolinylene, and benzothioazolylene). In addition, G can be a substituted or unsubstituted alkylene group, a substituted or unsubstituted arylene group, in a substituted or unsubstituted arylenealkylene group or alkylenearylene group, having the same definitions as Z.

In Structure (I), "a" represents at least 0.5 mol % and up to and including 100 mol % of (a) recurring units, based on the total recurring units in the photocurable or thermally curable thiosulfate-containing polymer. In many embodiments, "a" represents at least 0.5 mol % and up to and including 90 mol %, or at least 5 mol % and up to and including 75 mol %, or even up to and including 50 mol % of (a) recurring units, all based on the total recurring units in the photocurable or thermally curable thiosulfate-containing polymer.

M (can also be represented herein as M⁺) represents a suitable charge balancing cation such as a metal cation or an organic cation including but not limited to, an alkali metal ion (lithium, sodium, potassium, and cesium), quaternary ammonium, pyridinium, morpholinium, benzolium, imidazolium, alkoxypyridinium, thiazolium, and quinolinium monovalent cations. Divalent cations can be present in small amounts so that premature crosslinking of the thiosulfate polymer is minimized but in most embodiments, M is a monovalent charge balancing cation such as a potassium ion, sodium ion, pyridinium ion or thiazolium ion. In other embodiments, the organic charge balancing cations are particularly useful, including but not limited to, ammonium, pyridinium, morpholinium, benzolium, imidazolium, alkoxypyridinium, thiazolium, and quinolinium monovalent cations.

Any photocurable or thermally curable thiosulfate-containing polymer containing one or more thiosulfate groups as described herein can be used in the present invention. For example, suitable photocurable or thermally curable thiosulfate-containing polymers can include but are not limited to, vinyl polymers derived at least in part from methacrylate or acrylate ethylenically unsaturated polymerizable monomers (known herein as "polymethacrylates" and "polyacrylates", including both homopolymers and copolymers), polyethers, poly(vinyl ester)s, and polystyrenes (including homopolymers and copolymers derived from styrene and styrene derivatives having one or more substituents on the pendant benzene ring or attached along the polymer backbone). Such photocurable or thermally curable thiosulfate-containing polymers have an entirely carbon backbone. However, pendant thiosulfate groups can be present in condensation polymers including but not limited to, polyesters, polyamides, polyurethanes, polycarbonates, polymers derived from cellulose esters, and polysiloxanes using chemistry that would be readily known to one skilled in the art. In addition, the polyamide-epichlorohydrin-Bunte salts, polyoxyalkylene-Bunte salts, and polysiloxane-Bunte salts described in U.S. Pat. No. 5,424,062 (Schwan et al.) also can be used in the present invention.

The photocurable or thermally curable thiosulfate-containing polymers can also include other pendant groups and various recurring units to provide useful properties as described below for various embodiments.

In most embodiments of this invention, photocuring or thermal curing of the photocurable or thermally curable thiosulfate-containing polymers described herein is used to produce a crosslinked disulfide polymer wherein at least 5 mol %, or at least 50 mol %, and up to and including 100 mol % of the available thiosulfate groups are reacted to form disulfide bonds between adjacent or nearby thiosulfate groups. The product crosslinked disulfide polymers, however, can be obtained using other means that would be readily apparent to one skilled in the art.

For example, photocuring can take place upon exposure of a photocurable thiosulfate-containing polymer (in a precursor dielectric composition) using suitable radiation having a $\lambda_{max}$ of at least 150 nm and up to and including 1500 nm, or more likely using radiation having a $\lambda_{max}$ of at least 150 nm and up to and including 450 nm, wherein the pendant thiosulfate groups are electronically excited such that they react to form disulfide bonds and crosslink within the reacted polymer. Photoexposure can be carried out using suitable sources of such radiation for a suitable time to provide the needed curing energy. A skilled worker would know how to optimize the conditions for achieving desired crosslinking (disulfide bond formation), for example so that less than 10 mol % and more desirably less than 5 mol % of the original thiosulfate groups are unreacted after the photocuring process.

Useful thermal curing processes can also be carried out by heating a precursor dielectric composition to a temperature of at least 110° C. and up to and including 150° C. using a suitable source of heat such a hotplate, oven, infrared heating (for example, exposure to a near-infrared- or infrared-emitting laser), or other heating apparatus, for a sufficient time to obtain desired crosslinking (disulfide bond formation) such as at least 10 minutes and up to and including 30 minutes. A skilled artisan can readily determine the optimal heating temperature and time conditions that would be desirable to achieve the desired crosslinking.

The photocurable or thermally curable thiosulfate-containing polymer can comprise the (a) recurring units in an amount of at least 5 mol % and up to and including 50 mol %, based on total recurring units in the photocurable or thermally curable thiosulfate-containing polymer.

It is essential that the photocurable or thermally curable thiosulfate-containing polymers also contain suitable charge balancing cations (for example the "M" groups described above) so that the noted polymer has an essentially net neutral charge throughout the molecule. The term "essentially net neutral charge" means that at least 95 mol % of the available thiosulfate groups are associated with (or ionically bound to) charge balancing cations, and in most embodiments, at least 98 mol % and up to and including 100 mol % of the available thiosulfate groups are thusly counterbalanced in charge.

As noted below, these charge balancing cations can be located or provided in any suitable form or location as would be readily understood from the teaching provided below. In many embodiments, they are close enough to the pendant thiosulfate groups for charge association (or charge balancing) to form either binary salts or zwitterionic groups with the thiosulfate groups.

In some embodiments, the charge balancing cations are part of the organic polymer backbone of the photocurable or thermally curable thiosulfate-containing polymer and are not part of pendant groups attached to the organic polymer backbone.

Depending upon their location within the photocurable or thermally curable thiosulfate-containing polymers, the charge balancing cations can form binary salts with the pendant thiosulfate groups in the (a) recurring units and in such embodiments, the charge balancing cations can be any suitable monovalent cations such as inorganic metal cations including but not limited to, alkali metal ions such as lithium, sodium, potassium, and cesium, as well as organic monovalent cations as described below. The same or different charge balancing cations can be present in different (a) recurring units along the organic polymer backbone.

In some embodiments, the charge balancing cations can form zwitterionic groups with the pendant thiosulfate groups in (a) recurring units as represented by the following Structure (II):

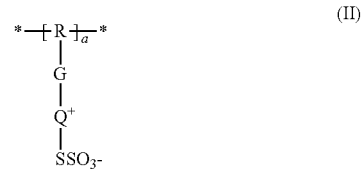

wherein R, G, and "a" are as defined for Structure (I) above. Q⁺ can be an organic charge balancing cation including but not limited to, quaternary ammonium cation, pyridinium cation, morpholinium cation, benzolium cation, imidazolium cation, alkoxypyridinium cation, thiazolium cation, and quinolinium cation. The quaternary ammonium cations, pyridinium cations, morpholinium cations, and thiazolium cations are particularly useful. Within such photocurable or thermally-curable thiosulfate-containing polymers, the (a) recurring units containing the thiosulfate groups can have the same or different organic charge balancing cation. In other words, Q⁺ can be the same or different in the various (a) recurring units along the polymer backbone. In most of such embodiments, the same organic charge balancing cation is used in all of the recurring units in a specific photocurable or thermally-curable thiosulfate-containing polymer.

Some particularly useful ethylenically unsaturated polymerizable monomers from which (a) recurring units can be derived, include:

p-vinylbenzyl thiosulfate sodium salt, 2-sodium thiosulfate ethyl methacrylate, and 2-sodium thiosulfate propyl methacrylate.

In addition, various precursor ethylenically unsaturated polymerizable monomers can be used to prepare precursor polymers having pendant reactive groups that can be converted to pendant thiosulfate groups. Representative monomers of this type include the following compounds:

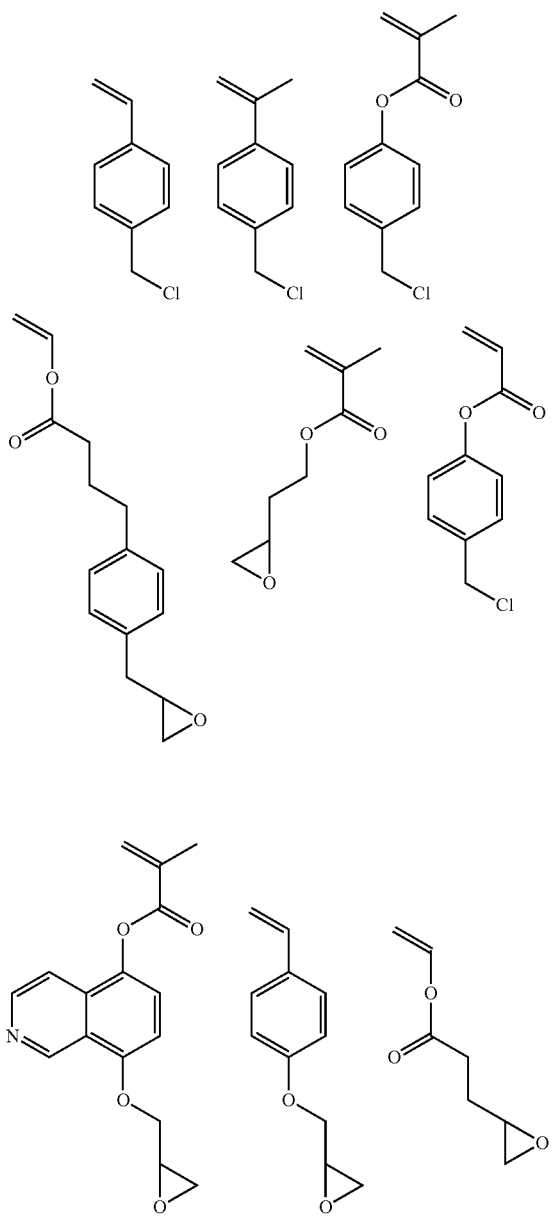

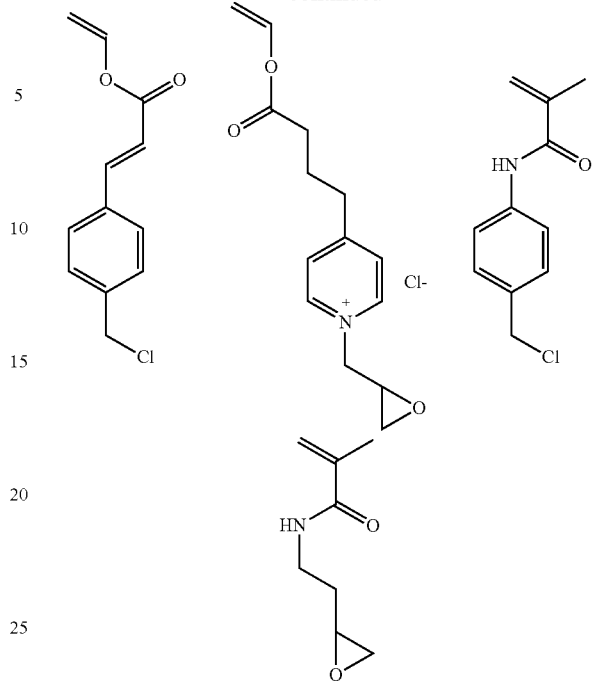

In some embodiments, the photocurable or thermally curable thiosulfate-containing polymer comprises: (a) recurring units comprising pendant thiosulfate groups, and (b) recurring units comprising charge balancing cations that are associated with the (a) recurring units sufficiently to provide a net neutral charge with the pendant thiosulfate groups. Thus, the (b) recurring units are generally present in an amount at least equal to the (a) recurring units, but the (b) recurring units can be present in greater amounts if desired. Such embodiments with (a) recurring units and (b) recurring units can be represented by the following Structure (III) showing adjacent (a) recurring units and (b) recurring units:

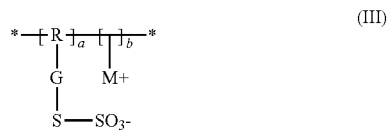

(III)

wherein R, G, and M$^+$ (also represented as M) are as defined above. Within Structure (III), "a" represents at least 0.5 mol % and up to and including 50 mol %, or at least 1 mol % and up to and including 40 mol %, of (a) recurring units, and "b" represents the (b) recurring units and is at least equal to the "a" mol % but can be greater than the "a" mol %, all based on the total recurring units in the photocurable or thermally-curable thiosulfate-containing polymers. In most of these embodiments, the amount of (b) recurring units is essentially equal to the amount of (a) recurring units. The term "essentially" refers to the definition of "essential net neutral charge" defined above.

In some embodiments, the photocurable or thermally curable thiosulfate-containing polymer that which comprises the (a) recurring units in an amount of at least 0.5 mol % and up to and including 50 mol %, and the (b) recurring units in an amount of at least 0.5 mol % and up to and including 50 mol % recurring units, all based on total recurring units in the photocurable or thermally curable thiosulfate-containing polymer.

Such (b) recurring units can be located at any point along the polymer backbone as long as the (b) recurring units are associated with (near to) the (a) recurring units containing the pendant thiosulfate groups. Thus, the (b) recurring units can be randomly distributed along the polymer backbone or they can be in blocks along the polymer backbone, as long as the $M^+$ charge balancing cations (typically, organic charge balancing cations) are able to counterbalance the associated thiosulfate negative charges.

Useful (b) recurring units can be derived from ethylenically unsaturated polymerizable monomers containing suitable charge balancing cations including but not limited to, quaternary ammonium cations, pyridinium cations, morpholinium cations, and thiazolium cations.

It is also possible that useful photocurable or thermally curable thiosulfate-containing polymers can comprise (a) recurring units represented by either of both of Structures (I) and (II), along with (b) recurring units represented by Structure (III).

Still other useful photocurable or thermally curable thiosulfate-containing polymers can comprise at least (a) recurring units, as well as (c) recurring units comprising a photosensitizer component $R_2$ as represented by Structure IV below.

(IV)

wherein R' is an organic polymer backbone, G' is a single bond or a suitable divalent linking group that can be any of those defined for G as noted above, $R_2$ is a electron-accepting photosensitizer component as defined below, and c is at least 1 mol % and up to and including 10 mol %, or typically at least 2 mol % and up to and including 8 mol %, of (c) recurring units, all based on the total recurring units in the photocurable or thermally curable thiosulfate-containing polymer.

For example, representative electron-accepting photosensitizer components can be derived from compounds that include but are not limited to, cyano-substituted carbocyclic aromatic compounds or cyanoaromatic compounds (such as 1-cyanonaphthalene, 1,4-dicyanonaphthalene, 9,10-dicyanoanthracene, 2-t-butyl-9,10-dicyanoanthracene, 2,6-di-t-butyl-9,10-dicyanoanthracene, 2,9,10-tricyanoanthracene, 2,6,9,10-tetracyanoanthracene), aromatic anhydrides and aromatic imides (such as 1,8-naphthylene dicarboxylic, 1,4,6,8-naphthalene tetracarboxylic, 3,4-perylene dicarboxylic, and 3,4,9,10-perylene tetracarboxylic anhydride or imide), condensed pyridinium salts (such as quinolinium, isoquinolinium, phenanthridinium, acridinium salts), and pyrylium salts. Useful electron-accepting photosensitizer components that involve the triplet excited state include but are not limited to, components derived from carbonyl compounds such as quinones (for example, benzo-, naphtho-, and anthro-quinones with electron withdrawing substituents such as chloro and cyano). Ketocoumarins, especially those with strong electron withdrawing moieties such as pyridinium, can also be used to provide electron-accepting photosensitizer components. These compounds can optionally contain substituents such as methyl, ethyl, tertiary butyl, phenyl, methoxy, and chloro groups that can be included to modify properties such as solubility, absorption spectrum, and reduction potential.

It is also possible that the photocurable or thermally curable thiosulfate-containing polymers comprising only (a) recurring units represented by either or both of Structure (I) or (II) and (c) recurring units represented by Structure (IV). Alternatively, the photocurable or thermally curable thiosulfate-containing polymers can comprise (a) recurring units represented by either or both of Structure (I) or (II) along with (b) recurring units represented by Structure (III) and (c) recurring units represented by Structure (IV).

Moreover, as described in more detail below, the charge balancing cations provided within the (c) recurring units represented by Structure (IV) can be the same or different from charge balancing cations that can be present in the (a) recurring units as represented by either or both of Structures (I) and (II), and they can be the same or different from the charge balancing cations present in the (b) recurring units represented by Structure (III). The noted (c) recurring units represented by Structure (IV) can thus comprise a photosensitizer component (as described above).

In still other embodiments of this invention, the photocurable or thermally curable thiosulfate-containing polymer can comprise (a) recurring units as described above (for example, either or both Structures (I) and (II)), optionally (b) recurring units as described above (for example, as represented by Structure (III)), optionally (c) recurring units (for example, as represented by Structure (IV)), but also (d) recurring units derived from one or more linear, branched, or carbocyclic non-aromatic hydrocarbon (meth)acrylates comprising a linear, branched, or carbocyclic non-aromatic hydrocarbon ester group comprising at least 1 carbon atom and up to and including 18 carbon atoms or more likely at least 6 carbon atoms and up to and including 18 carbon atoms. Alternatively, the (d) recurring units can also be derived from one or more alkyl-substituted aryl (meth) acrylates in which the aryl group (such as phenyl) is substituted with one or more linear, branched or carbocyclic non-aromatic hydrocarbon substituent(s) at least one of which substituents comprises at least 6 carbon atoms and up to and including 18 carbon atoms. The aryl groups (such as phenyl group) are typically not further substituted.

Such (d) recurring units can be represented by the following Structure (V):

(V)

wherein R" represents an organic polymer backbone, G" is a carbonyloxy group to provide an acrylate group with $R_3$. $R_3$ comprises a monovalent linear, branched, or carbocyclic non-aromatic hydrocarbon group having 1 to 18 carbon atoms, or it comprises an aryl group (such as a phenyl group) having one or more linear, branched, or carbocyclic non-aromatic hydrocarbon substituents. At least one of these linear, branched, or carbocyclic non-aromatic hydrocarbon substituents has at least 6 carbon atoms and up to and including 18 carbon atoms. Such aryl groups are not typically further substituted beyond one linear, branched, or carbocyclic non-aromatic hydrocarbon substituent.

For example, such (d) recurring units represented by Structure (V) can be derived for example from one or more alkyl acrylates, one or more alkyl methacrylates, one or more alkyl acrylates and one or more alkyl methacrylates, or one or more arylacrylates or aryl methacrylates, which comprise the alkyl ester groups as defined above including but not limited to, acrylates and methacrylates comprising n-hexyl, n-heptyl, n-octyl, n-nonyl, n-decyl, or n-dodecyl groups, branched isomers thereof, or phenyl groups substituted with at least one of such linear or branched alkyl groups.

In Structure (V), "d" represents at least 1 mol % and up to and including 40 mol %, or typically at least 1 mol % and up to and including 30 mol % of (d) recurring units, all based on the total recurring units in the photocurable or thermally curable thiosulfate-containing polymer.

As described above, the thiosulfate groups in the (a) recurring units are generally located pendant to the polymer backbone, and such groups can be incorporated into the recurring units by appropriate reaction (described below) with precursor recurring units. The photocurable or thermally curable thiosulfate-containing polymers can comprise different recurring units derived from two or more different ethylenically unsaturated polymerizable monomers as described above for the (a), (b), (c), and (d) recurring units.

In addition to the (a), (b), (c), and (d) recurring units described above, the photocurable or thermally curable thiosulfate-containing polymers can also comprise (e) recurring units that are different from all of the noted (a) through (d) recurring units and can provide desired film-forming or other properties that are not specific the dielectric function of the resulting crosslinked polymer. A skilled polymer chemist would understand how to choose such optional recurring units, and for example, they can be derived from one or more ethylenically unsaturated polymerizable monomers selected from the group consisting of alkyl acrylates including hydroxyalkyl acrylates, alkyl methacrylates including hydroxyalkyl methacrylates, (meth)acrylamides, styrene and styrene derivatives, vinyl ethers, vinyl benzoates, vinylidene halides, vinyl halides, vinyl imides, and other materials that a skilled worker in the art would understand could provide desirable properties to the reactive polymer. Some (e) recurring units can comprise an epoxy (such as a glycidyl group) or epithiopropyl group derived for example from glycidyl methacrylate or glycidyl acrylate to provide additional crosslinking capability. If present, these (e) recurring units can be present in an amount of up to and including 50 mol % based on the total recurring units in the photocurable or thermally curable thiosulfate-containing polymer.

In some embodiments of this invention, the photocurable or thermally curable thiosulfate-containing polymer comprises at least some (a) recurring units, and optionally (b) recurring units, but further comprises:

(c) recurring units that are represented by Structure (IV) noted above;

(d) recurring units that are represented by Structure (V) noted above; or both (c) recurring units and (d) recurring units.

In very useful embodiments, the precursor dielectric composition or method used to prepare a device is designed so that:

(A) the photocurable or thermally curable thiosulfate-containing polymer comprises:

(a) recurring units that are represented by the following Structure (I) or Structure (II), or both Structures (I) and (II):

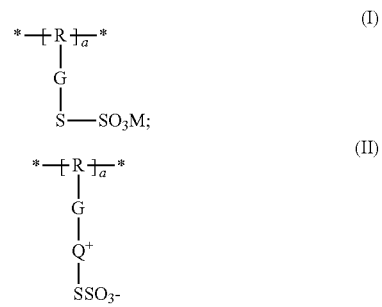

wherein R represents an organic polymer backbone, G is a single bond or divalent linking group, $Q^+$ is an organic charge balancing cation, M represents a charge balancing cation, and "a" represents at least 0.5 mol % and up to and including 100 mol % of (a) recurring units, based on the total recurring units in the photocurable or thermally curable thiosulfate-containing polymer; or (B) the photocurable or thermally curable thiosulfate-containing polymer is represented by the following Structure (III):

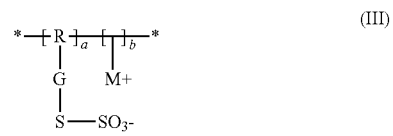

wherein R represents an organic polymer backbone, G is a single bond or a divalent linking group, $M^+$ is a charge balancing cation, and "a" and "b" are as described above for Structure (III); and (C) the photocurable or thermally curable thiosulfate-containing polymer of (A) or (B) optionally further comprises:

(c) recurring units that are represented by the Structure (IV) described above;

(d) recurring units that are represented by Structure (V) described above; or both (c) recurring units and (d) recurring units.

Some particular useful photocurable or thermally curable thiosulfate-containing polymers have a glass transition temperature ($T_g$) of at least 50° C. and each comprises an organic polymer backbone comprising:

(a) recurring units comprising pendant thiosulfate groups, based on the total recurring units in the photocurable or thermally curable thiosulfate-containing polymer, and (b) recurring units comprising organic charge balancing cations that are associated with the (a) recurring units sufficiently to provide a net neutral charge with the pendant thiosulfate groups, which photocurable or thermally curable thiosulfate-containing polymer is represented by the following Structure (III):

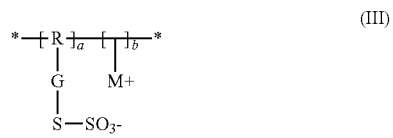

wherein R represents an organic polymer backbone, G is a single bond or a divalent linking group (as described above), M⁺ represents the organic charge balancing cation (as described above), and "a" and "b" are as described above for Structure (III).

For example, the organic charge balancing cations can be selected from quaternary ammonium, pyridinium, morpholinium, benzolium, imidazolium, alkoxypyridinium, thiazolium, and quinolinium monovalent cations.

Such photocurable or thermally curable thiosulfate polymers can be further modified and defined wherein the (a) recurring units are represented by the following Structure (II):

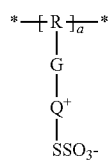

wherein R represents an organic polymer backbone, G is a single bond or divalent linking group (as described above), Q⁺ is an organic charge balancing cation (as described above), and "a" is the mol % of (a) recurring units as described above.

Such photocurable or thermally curable thiosulfate polymer can further comprise (c) recurring units that are represented by the following Structure (IV):

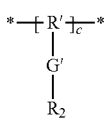

wherein R' represents an organic polymer backbone, G' is a divalent linking group (as described above), $R_2$ is a electron-accepting photosensitizer component (as described above), and "c" represents at least 1 mol % and up to and including 10 mol % of (c) recurring units, based on the total recurring units in the photocurable or thermally-curable thiosulfate-containing polymer.

In still other embodiments, such photocurable or thermally curable thiosulfate-containing polymers having (a) recurring units and either or both (b) and (c) recurring units can further comprise (d) recurring units that are represented by the following Structure (V):

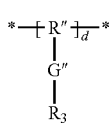

wherein R" represents an organic polymer backbone, G" is a carbonyloxy group, $R_3$ (as described above) comprises a monovalent linear, branched, or carbocyclic non-aromatic hydrocarbon group having 1 to 18 carbon atoms, or it comprises a phenyl group having one or more linear, branched, or carbocyclic non-aromatic hydrocarbon substituents, at least one linear, branched, or carbocyclic non-aromatic hydrocarbon substituents has at least 6 carbon atoms and up to and including 18 carbon atoms, and "d" represents at least 1 mol % and up to and including 40 mol % of (d) recurring units, based on the total recurring units in the photocurable or thermally-curable thiosulfate-containing polymer.

Any of these useful photocurable or thermally curable thiosulfate-containing polymers can further comprise (e) recurring units that are different from (a) recurring units, (b) recurring units, (c) recurring units, and (d) recurring units, which (e) recurring units are present in an amount of up to and including 50 mol %, based on the total recurring units in the photocurable or thermally curable thiosulfate-containing polymer.

Still other useful photocurable or thermally curable thiosulfate-containing polymers have a $T_g$ of at least 50° C. and each comprises an organic polymer backbone comprising: (a) recurring units comprising pendant thiosulfate groups, based on the total recurring units in the photocurable or thermally curable thiosulfate-containing polymer, and (d) recurring units, which (a) recurring units are represented by either Structure (I) or (II) below, and the (d) recurring units are represented by Structure (V) below:

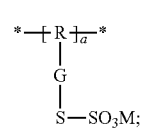

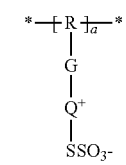

wherein R represents an organic polymer backbone, G is a single bond or divalent linking group (as described above), Q⁺ is an organic charge balancing cation (as described above), M represents a charge balancing cation (as described above), and "a" represents at least 0.5 mol % and up to and including 99.5 mol % of (a) recurring units, based on the total recurring units in the photocurable or thermally curable thiosulfate-containing polymer;

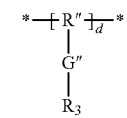

wherein R" represents an organic polymer backbone, G" is a carbonyloxy group, $R_3$ (as described above) comprises a monovalent linear, branched, or carbocyclic non-aromatic hydrocarbon group having 1 to 18 carbon atoms, or it comprises a phenyl group having one or more branched, or carbocyclic non-aromatic hydrocarbon substituents, at least one of which has at least 6 carbon atoms and up to and including 18 carbon atoms, and "d" represents at least 0.5 mol % and up to and including 99.5 mol % of (d) recurring units, based on the total recurring units in the photocurable or thermally-curable thiosulfate-containing polymer.

For example, the organic charge balancing cations are selected from quaternary ammonium, pyridinium, morpholinium, benzolium, imidazolium, alkoxypyridinium, thiazolium, and quinolinium monovalent cations.

Such useful photocurable or thermally curable thiosulfate polymers can further comprising (c) recurring units that are represented by the following Structure (IV):

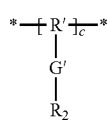

wherein R' represents an organic polymer backbone, G' is a single bond or a divalent linking group, $R_2$ is a electron-accepting photosensitizer component, and "c" represents at least 1 mol % and up to and including 10 mol % of (c) recurring units, based on the total recurring units in the photocurable or thermally-curable thiosulfate-containing polymer.

For example, such photocurable or thermally curable thiosulfate-containing polymers can comprise the (a) recurring units in an amount of at least 5 mol % and up to and including 30 mol % of (a) recurring units, and the (d) recurring units in an amount of at least 1 mol % and up to and including 30 mol % of (d) recurring units, all based on total recurring units in the photocurable or thermally curable thiosulfate-containing polymer.

Some of the precursor ethylenically unsaturated polymerizable monomers useful for making these photocurable or thermally curable thiosulfate-containing polymers useful in the present invention can be obtained from various commercial sources. In other embodiments, the photocurable or thermally curable thiosulfate-containing polymer can be prepared in several ways using understanding and reactants available to a skilled polymer chemist. For example, the useful precursor monomers and reactive ethylenically unsaturated polymerizable co-monomers can be obtained from a number of commercial sources or readily prepared, and then polymerized using known conditions.

Thiosulfate-containing recurring units can be prepared from the reaction between an alkyl halide and thiosulfate salt as described in the seminal teaching of Bunte, Chem. Ber. 7, 646, 1884. Thiosulfate polymers can be prepared from preformed polymers having requisite reactive groups. For example, if the functional ethylenically unsaturated polymerizable monomer is a vinyl halide polymer, the functional vinyl polymerizable monomer can be prepared as illustrated as follows:

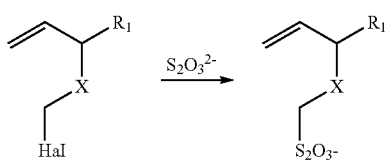

wherein $R_1$ is hydrogen or a substituted or unsubstituted alkyl group comprising 1 to 10 carbon atoms or an aryl group, Hal represents a halide, and X represents a divalent linking group as defined above. The conditions for these reactions are known in the art.

Reactive polymers containing pendant thiosulfate groups can also be prepared from preformed polymers in a similar manner as described in U.S. Pat. No. 3,706,706 (Vandenberg), the disclosure of which is incorporated herein by reference for the polymer synthetic methods:

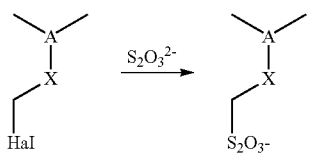

wherein A represents the polymer backbone, Hal represents a halide, and X represents a divalent linking group as described above.

In addition, photocurable or thermally curable thiosulfate-containing polymers containing pendant thiosulfate groups can be prepared using the reaction of an alkyl epoxide (on a preformed polymer or a functional monomer) with a thiosulfate salt, or between an alkyl epoxide (on a preformed polymer of a functional monomer) and a molecular containing a thiosulfate moiety (such as 2-aminoethanethiosulfuric acid), as illustrated by Thames, Surf. Coating, 3 (Waterborne Coat.), Chapter 3, pp. 125-153, Wilson et al (Eds.) and as follows:

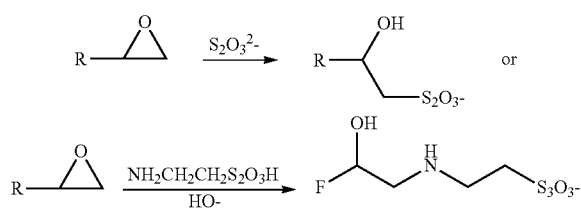

wherein R represents a substituted or unsubstituted alkyl or aryl groups. The conditions for these reactions are known in the art and require only routine experimentation to complete.

The mol % amounts of the various recurring units defined herein for the photocurable or thermally curable thiosulfate-containing polymers described herein are meant to refer to the actual molar amounts present in the formed polymers. It is understood by one skilled in the art that the actual mol % values may differ from those theoretically possible (nominal mol %) from the amounts of ethylenically unsaturated polymerizable monomers that can be used in the polymerization procedure, or the reactive components used to prepare condensation polymer. However, under most polymerization conditions that allow high polymer yield and optimal reaction of all monomers, the actual mol % of each monomer is generally within ±15 mol % of the theoretical (nominal) amounts.

Some representative photocurable or thermally curable thiosulfate-containing polymer embodiments include but are not limited to, the following materials wherein the molar ratios are theoretical (nominal) amounts based on the actual molar ratio of ethylenically unsaturated polymerizable monomers used in the polymerization process. The actual molar amounts of recurring units can differ from the theoretical (nominal) amounts of monomers if the polymerization reactions are not carried out to completion.

Poly(methacrylic acid-co-p-vinylbenzyl thiosulfate sodium salt) (98:2);
Poly(acrylic acid-co-p-vinylbenzyl thiosulfate sodium salt) (80:20);
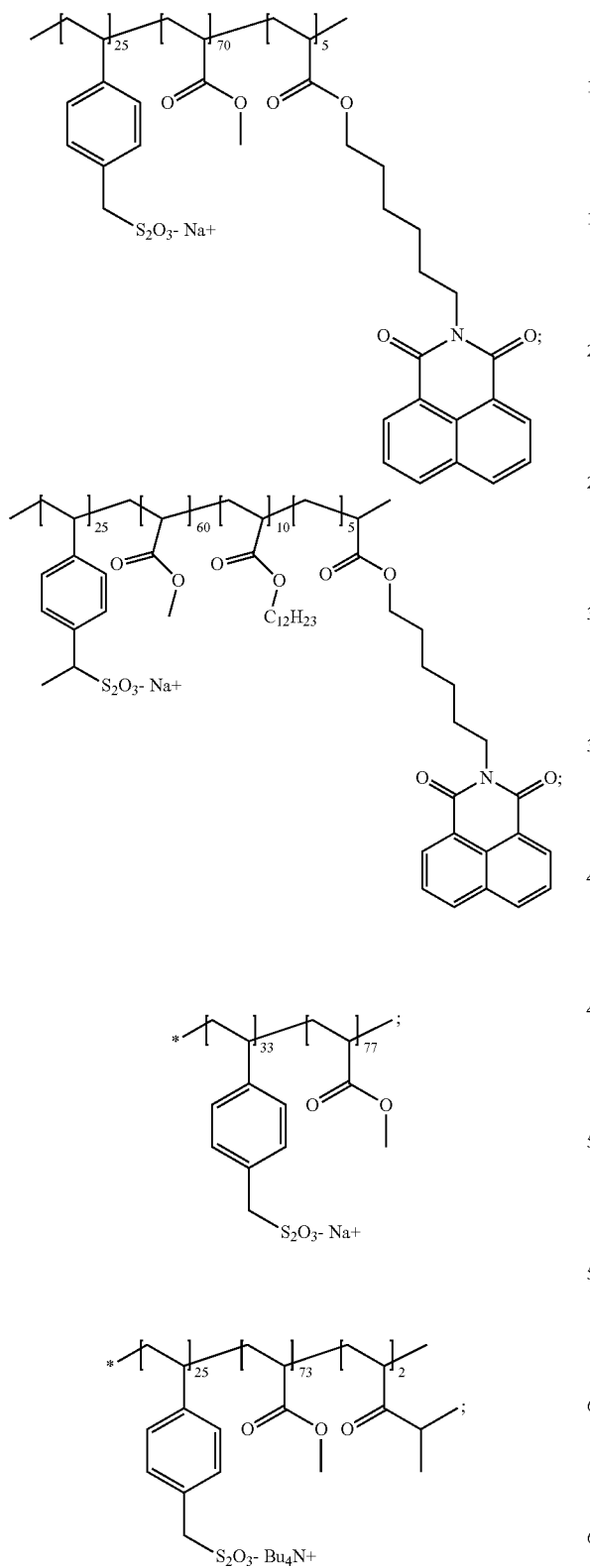
-continued -continued

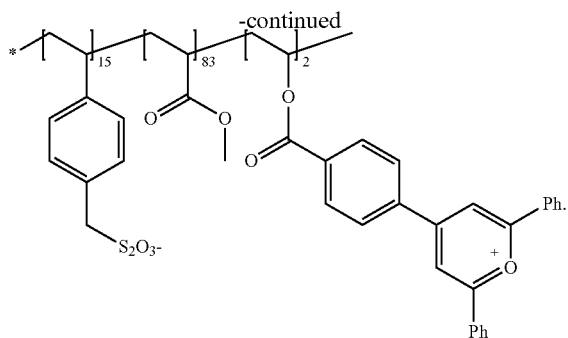

Useful photocurable or thermally curable thiosulfate-containing polymers used in this invention generally have a molecular weight ($M_n$) of at least 1,000 and up to and including 1,000,000, or typically at least 10,000 and up to and including 100,000, as determined using size exclusion chromatography (SEC).

Useful photocurable or thermally curable thiosulfate-containing polymers used in this invention can also have a glass transition temperature ($T_g$) of at least 50° C. and up to and including 250° C. or at least 70° C. and up to and including 150° C., as determined using Differential Scanning calorimetry (DSC).

Using the teaching described above, the precursor polymers can be prepared using known free radical solution polymerization techniques using known starting materials, free radical initiators, and reaction conditions in suitable organic solvents that can be adapted from known polymer chemistry, or using known condensation polymerization processes. Where starting materials (monomers) are not available commercially, such starting materials can be synthesized using known chemical starting materials and procedures. The precursor polymers can then be reacted to form the desired thiosulfate groups to form desired photocurable or thermally curable thiosulfate-containing polymers.

Representative preparations of useful photocurable or thermally curable thiosulfate-containing polymers are provided below for the Invention Examples.

Precursor Dielectric Compositions

The photocurable or thermally curable thiosulfate-containing polymers described above can be incorporated and used in precursor dielectric compositions that are used to form precursor dielectric layers (or precursor gate dielectric layers) as described below. Such precursor dielectric layers are generally crosslinked by thermal curing or photocuring the photocurable or thermally-curable thiosulfate-containing polymer provided in the noted precursor dielectric composition. FIG. 2 shows general photocuring and thermal curing schemes.

Each precursor dielectric composition has only one essential component, that is, one or more photocurable or thermally curable thiosulfate-containing polymers as described above that can be thermally crosslinked (thermally cured) by heating the precursor dielectric composition as described above, or it can be photocrosslinked (photocured) upon exposure to radiation having $\lambda_{max}$ of at least 150 nm and up to and including 700 nm, or of at least 150 nm and up to and including 450 nm, as described above.

One or more photocurable or thermally curable thiosulfate-containing polymers are generally present in the precursor dielectric composition in an amount of at least 50 weight % and up to and including 100 weight %, or typically at least 90 weight % and up to and including 100 weight %, based on the total solids in the precursor dielectric composition (or total dry weight of the applied precursor gate dielectric layer).

The precursor dielectric compositions generally do not include separate crosslinking agents or crosslinking agent precursors because the photocurable or thermally curable thiosulfate-containing polymer itself generally includes pendant thiosulfate groups for crosslinking (to form disulfide bonds). However, if desired, additional crosslinking can be provided by including recurring units in polymer backbone comprising crosslinkable groups such as pendant epoxy groups.

In some embodiments, the precursor dielectric composition (and resulting gate dielectric layers) can further comprise one or more photosensitizer components to enhance the sensitivity of photocurable or thermally curable thiosulfate-containing polymers to specific longer wavelengths (for example, at least 300 nm and up to and including 700 nm). A variety of photosensitizers are known in the art that can be incorporated as individual photosensitizer components in the precursor dielectric composition, including but not limited to, benzothiazole and naphthothiazole compounds as described in U.S. Pat. No. 2,732,301 (Robertson et al.), aromatic ketones as described in U.S. Pat. No. 4,507,497 (Reilly, Jr.), and ketocoumarins, as described for example in U.S. Pat. No. 4,147,552 (Specht et al.) and U.S. Pat. No. 5,455,143 (Ali). Particularly useful photosensitizers for long UV and visible light sensitivity include but are not limited to, 2-[bis(2-furoyl)methylene]-1-methyl-naphtho[1,2-d]thiazoline, 2-benzoylmethylene-1-methyl-β-napthothiazoline, 3,3'-carbonylbis(5,7-diethoxycoumarin), 3-(7-methoxy-3-coumarinoyl)-1-methylpyridinium fluorosulfate, 3-(7-methoxy-3-coumarinoyl)-1-methylpyridinium 4-toluenesulfonic acid, and 3-(7-methoxy-3-coumarinoyl)-1-methylpyridinium tetrafluoroborate. Other useful photosensitizers are described in Columns 6 and 7 of U.S. Pat. No. 4,147,552 (noted above) which disclosure of such compounds is incorporated herein by reference.

When present as individual photosensitizer compounds, the photosensitizer components can be present in the precursor dielectric composition (and resulting dry gate dielectric layer) in an amount of at least 0.1 weight % and up to and including 10 weight %, or more likely at least 0.5 weight % and up to and including 5 weight %, based on the total solids in the precursor dielectric composition (or total dry weight of the gate dielectric layer).

When the photosensitizer component is provided as part of one or more recurring units as described above (for example, (c) recurring units), it can be present in the precursor dielectric composition (and dry gate dielectric layer) in an amount of at least 1 mol % and up to and including 10 mol % of the recurring units based on the total recurring units of the photocurable or thermally curable thiosulfate-containing polymers. The exact amount of the photosensitizer component will obviously depend upon the extinction coefficient of the particular molecule and a skilled worker can vary the amount of the (c) recurring units or individual photosensitizer compounds appropriately for the precursor dielectric composition.

The precursor dielectric compositions can optionally include one or more addenda such as other film-forming compounds (including film-forming polymers that do not contain thiosulfate groups), surfactants, plasticizers, filter dyes, viscosity modifiers, and any other materials that would be readily apparent to one skilled in the art, and such addenda can be present in amounts that would also be readily apparent to one skilled in the art.

The essential photocurable or thermally curable thiosulfate-containing polymer and any optional compounds described above are generally dissolved or dispersed in one or more organic solvents to form a precursor dielectric composition that can be applied to a suitable substrate (described below) in any suitable manner. Useful organic solvents include but are not limited to, alcohols such as methanol, ethanol, isopropanol, n-butanol, cyclohexanol, and Dowanol™, ketones such as acetone and butanone, tetrahydrofuran, N,N-dimethylformamide, dioxane, toluene, and mixtures of two or more such organic solvents. Water can be included with one or more of these organic solvents as long as water present only in amounts that would be miscible in the solvent mixture.

Electronic Devices and Preparation

The present invention provides a method for preparing an electronic device comprising:

independently applying a precursor dielectric composition (as described above) and an organic semiconductor composition to a substrate to form an applied precursor dielectric layer and an applied organic semiconductor composition, respectively, and subjecting the applied precursor dielectric composition to curing conditions to form a gate dielectric layer comprising a photochemically cured or thermally cured products of a photocurable or thermally curable thiosulfate-containing polymer, which gate dielectric layer is in physical contact with the applied organic semiconductor composition.

The present invention provides a method of making an OFET or similar devices that include a gate dielectric layer provided according to the present invention. In general, the method comprises independently applying a precursor dielectric composition as described above, and an organic semiconductor composition (described below) to a substrate (as described below) in any suitable manner known in the art. These compositions can be applied in any desired order. Once applied, they are dried using known techniques. The dried precursor dielectric composition, when cured (that can also occur at least partially during drying), then forms a gate dielectric layer that is in physical contact with the dried organic semiconductor composition.

The dried precursor dielectric layer can be photocured or thermally cured using suitable curing equipment and conditions to form a crosslinked disulfide polymer product from the photocurable or thermally curable thiosulfate-containing polymer, forming a dielectric material (or gate dielectric layer). Representative conditions for each type of curing are described above.

More particularly, an electronic device of this invention can be prepared using a method comprising:

applying a precursor dielectric composition as described above to a suitable substrate to form an applied precursor dielectric composition, removing any organic solvent(s) from the applied precursor dielectric composition, simultaneously or subsequently, curing the applied precursor dielectric composition to form a gate dielectric layer comprising a crosslinked disulfide polymer product (derived from the photocurable or thermally curable thiosulfate-containing polymer), applying an organic semiconductor composition (described below) to the gate dielectric layer to form an organic semiconductor layer (which is dried at some point), and forming one or more sets of electrically conductive source and drain electrodes on the dried organic semiconductor layer.

In still other embodiments of this invention, a process for fabricating a thin-film conducting device comprises:

providing a substrate from among the materials described below (for example, a flexible material such as a flexible polymeric film), providing a gate electrode material over the substrate, forming a gate dielectric layer (comprising a crosslinked disulfide polymer product provided according to the present invention) over the gate electrode material by applying, drying, and curing a precursor dielectric composition described above (generally having a dry thickness of less than 1 μm), providing a thin film of an organic semiconductor material to provide a thin film organic semiconductor layer adjacent the gate dielectric layer, and providing a source electrode and a drain electrode contiguous to the thin-film of the organic semiconductor material.

Any precursor dielectric composition described herein can be used to prepare the gate dielectric layer in the OFET's or other devices of the present invention, and such precursor dielectric compositions can comprise one or more photocurable or thermally curable thiosulfate-containing polymers described above. An integrated circuit comprising a plurality of OFET's is also provided by the present invention when each OFET is provided using the features described above.

Any known thin film transistor or field effect transistor configuration is possible with the invention. For example, the source and drain electrodes can be adjacent to the gate dielectric layer with the organic semiconductor layer over the source and drain electrodes, or the organic semiconductor layer may be interposed between the source and drain electrodes and the gate dielectric layer. In each option, the invention provides a crosslinked disulfide polymer product in the gate dielectric layer.

Representative organic field effect transistor (OFET) are illustrated in FIGS. 1a-1d, comprising source electrode 40, drain electrode 50, gate electrode 60, gate dielectric layer 20 comprising a crosslinked disulfide polymer product, substrate 10, and semiconductor organic layer 30 in the form of a film connecting source electrode 40 to drain electrode 50, which organic semiconductor layer comprises a compound as described below. When the OFET operates in an accumulation mode, the charges injected from source electrode 40 into the organic semiconductor layer 30 are mobile and a current flows from source 40 to drain 50, mainly in a thin channel region within about 100 Angstroms of the semiconductor-gate dielectric layer interface. In the configuration of FIG. 1a, the charge need only be injected laterally from source electrode 40 to form the channel. In the configuration of FIG. 1b, the charge is injected vertically for source electrode 40 into organic semiconductor layer 30 to form the channel. In the absence of a gate field, the channel ideally has few charge carriers and as a result there is ideally no source-drain conduction.

The off current is defined as the current flowing between source electrode 40 and drain electrode 50 when charge has not been intentionally injected into the channel by the application of a gate voltage. For an accumulation-mode TFT, this occurs for a gate-source voltage more negative, assuming an n-channel, than a certain voltage known as the threshold voltage. The "on" current is defined as the current flowing between source electrode 40 and drain electrode 50 when charge carriers have been accumulated intentionally in the channel by application of an appropriate voltage to gate electrode 60, and the channel is conducting. For an n-channel accumulation-mode TFT, this occurs at gate-source voltage more positive than the threshold voltage. It is desirable for this threshold voltage to be zero or slightly positive for n-channel operation. Switching between on and off is accomplished by the application and removal of an electric field from gate electrode 60 across gate dielectric layer 20 to the semiconductor-dielectric interface, effectively charging a capacitor.

In accordance with the present invention, the precursor dielectric composition described above can be used to provide gate dielectric layers (also known as gate insulator layers) in the devices described herein, to improve electrical properties, without the need for additional surface treatment or coating another layer on the surface to which the precursor dielectric compositions are applied.

The devices of this invention can comprise the gate dielectric layers described herein and such devices can be electronic device including but not limited to, organic field effect transistors (OFET's), optical devices such as organic light emitting diodes (OLED's), photodetectors, sensors, logic circuits, memory elements, capacitors, and photovoltaic (PV) cells. However, just because not every type of device is described in detail, it is not contemplated that the present invention is useful only as OFET's. A skilled artisan in the various arts would know how to use the precursor dielectric compositions described herein for those other types of devices.

In one embodiment, a suitable flexible substrate (such as a polymeric film, flexible glass, or non-conductive foil) is provided and a precursor dielectric composition described herein is applied to the substrate, dried, and cured as described above, and suitable electrical contacts are made with the resulting gate dielectric layer. The particular method to be used can be determined by the structure of the desired semiconductor component. In the production of an OFET, for example, a gate electrode can be first deposited on a flexible substrate, a precursor dielectric composition can then be applied, dried, and cured onto it to form a gate dielectric layer, and then source and drain electrodes and a layer of a suitable semiconductor material can be applied on top of the gate dielectric layer.

The structure of such a transistor and hence the sequence of its production can be varied in the customary manner known to a person skilled in the art. For example, in another embodiment, a gate electrode can be formed first, followed by application of a precursor dielectric composition and gate dielectric layer formation, then the organic semiconductor layer can be formed, and finally the contacts for the source electrode and drain electrode can be formed on the organic semiconducting layer.

Still another embodiment can comprise formation of the source and drain electrodes formed first, then the organic semiconductor layer can be formed, followed by formation of the gate dielectric layer, and a gate electrode can be formed on the gate dielectric layer.

A skilled artisan would recognize that other useful structures can be constructed or intermediate surface modifying layers can be interposed between the above-described components of the thin film transistor. In most embodiments, a field effect transistor comprises the gate dielectric layer, a gate electrode, a organic semiconductor layer, a source electrode, and a drain electrode, wherein the gate dielectric layer, the gate electrode, the organic semiconductor layer, the source electrode, and the drain electrode are arranged in any sequence as long as the gate electrode, and the organic semiconductor layer both contact the gate dielectric layer, and the source electrode and the drain electrode both contact the organic semiconductor layer.

Substrates:

A substrate (sometimes known as a "support") can be used for supporting the gate dielectric layer and other components of an OFET or other device of this invention during manufacturing, testing, or use. A skilled artisan would appreciate that a substrate that is selected for commercial embodiments can be different from a substrate that is selected for testing or screening various embodiments. In other embodiments, a temporary substrate can be detachably adhered or mechanically affixed to another substrate. For example, a flexible polymeric substrate can be adhered to a rigid glass substrate that can be removed at some point.

In some embodiments, the substrate does not provide any necessary electrical function (such as electrical conductivity) for the device such as an organic field effect transistor. This type of support is considered a "non-participating support".

Useful substrate materials include both organic and inorganic materials including but not limited to, inorganic glasses, silicon wafer, ceramic foils, polymeric films, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) [sometimes referred to as poly(ether ether ketone) or PEEK], polynorbornenes, polyphenyleneoxides, poly(ethylene naphthalene) (PEN), poly(ethylene terephthalate) (PET), poly(phenylene sulfide) (PPS), and fiber-reinforced plastics (FRP).

Glass substrates, silicon wafers, and flexible polymeric films are particularly useful in the practice of this invention.

A flexible substrate (for example flexible polymeric, flexible glass, or flexible composite materials) can be used in some embodiments to allow for roll-to-roll processing (manufacturing), which can be a continuous process, and providing economy of scale and manufacturing compared to use of rigid supports. A flexible substrate can be designed to be wrapped around the circumference of a cylinder of less than 50 cm in diameter, or typically less than 25 cm in diameter, without distorting or breaking, using low force. A flexible substrate also can be rolled upon itself before or after manufacturing.

In some devices of the present invention, a substrate is optional. For example, in a top construction as illustrated in FIG. 1b, when the gate electrode or gate dielectric layer provides sufficient support for the intended use of the resultant TFT, a substrate is not needed. In addition, the substrate can be combined with a temporary support in which the support is detachably adhered or mechanically affixed to the substrate, such as when the support is desired for a temporary purpose, for example, for manufacturing, testing, transport, or storage. Thus, a flexible polymeric temporary support can be adhered to a rigid glass substrate, which flexible polymeric temporary support could be removed at an appropriate time.

Gate Electrode:

The gate electrode for OFET's can be composed of any useful conductive material. A variety of useful gate materials include but are not limited to, metals, degenerately doped semiconductors, conducting polymers, and printable materials such as carbon ink or a silver-epoxy. For example, the gate electrode can comprise doped silicon, or a metal such as aluminum, chromium, gold, silver, nickel, palladium, platinum, tantalum, or titanium, or mixtures thereof. Conductive polymers also can be used, including but not limited to, polyaniline, polypyrrole, and poly(3,4-ethylenedioxythiophene)/poly(styrene sulfonate) (PEDOT:PSS). In addition, alloys, combinations, and multilayers of these materials can be used in the gate electrode.

In some embodiments of the present invention, the same material can provide the gate electrode function and also provide a supporting (substrate) function. For example, doped silicon can function as the gate electrode and the substrate for an OFET.

Gate Dielectric Layer:

The gate dielectric layer (or dielectric layer) is provided on a gate electrode to electrically insulate the gate electrode from the rest of the electronic device (such as an OFET device). The gate dielectric layer is generally provided as a separate layer from a precursor dielectric composition as described above. In most embodiments, the gate dielectric layer consists essentially of one of more of the crosslinked disulfide polymer products described above with only non-essential materials as additional components. In yet other embodiments, the gate dielectric layer contains only of one or more of the crosslinked disulfide polymer products and an optional photo sensitizer component.

The gate dielectric layers provided according to this invention exhibit a suitable dielectric constant (k) that does not vary significantly with frequency. The gate dielectric layer can have a resistivity of at least $10^{14}$ ohm-cm in OFET devices.

In some embodiments, the gate dielectric layers described herein can possess one or more of the following characteristics: they are formed from precursor dielectric compositions that can be applied out of organic solutions and are crosslinkable, have high thermal stability (for example, they are stable up to a temperature of at least 250° C.), and are compatibility with flexible substrates.

For OFET's for example, the gate dielectric layer generally has an average dry thickness of at least 3,500 Angstroms (Å) and up to and including 15,000 Angstroms (Å), or typically up to and including 10,000 Å, or at least 5,000 Å. The dry thickness can be determined using known methods such as ellipsometry and profilometry and the "average" can be determined from at least five separate measurements in different locations of the gate dielectric layer. For embedded capacitors and printed circuit board applications, the dry gate dielectric layer thickness can include those described above for OFET's, but can also be at least 10 µm or at least 20 µm and up to and including 50 µm.

Source and Drain Electrodes:

The source electrode and drain electrode are separated from a gate electrode by the gate dielectric layer while the organic semiconductor layer can be over or under the source electrode and drain electrode. The source and drain electrodes can be composed of any useful conductive material including but not limited to, those materials described above for the gate electrode, for example, aluminum, barium, calcium, chromium, gold, silver, nickel, palladium, platinum, titanium, polyaniline, PEDOT:PSS, graphene, reduced graphene oxide (r-GO), composites of graphene, composites of reduced graphene oxide, other conducting polymers, composites thereof, alloys thereof, combinations thereof, and multilayers thereof.

The thin film electrodes (for example, gate electrode, source electrode, and drain electrode) can be provided by any useful means such as physical vapor deposition (for example, thermal evaporation, sputtering), microcontact printing, flexographic printing, photolithography, or ink jet printing. The patterning of these electrodes can be accomplished by known methods such as shadow masking, additive photolithography, subtractive photolithography, printing, microcontact printing, and pattern coating.

The organic semiconductor layer can be provided over or under the source and drain electrodes, as described above in reference to the thin film transistor article.

Useful materials that can be formed into n-type or p-type organic semiconductor layers are numerous and described in various publications. For example, useful semiconductor materials can be prepared using poly(3-hexylthiophene) (P3HT) and its derivatives, the tetracarboxylic diimide naphthalene-based compounds described in U.S. Pat. No. 7,422,777 (Shukla et al.), the N,N'-diaryl-substituted 1,4,5,8-naphthalene tetracarboxylic acid diimides having electron withdrawing groups as described in U.S. Pat. No. 7,629,605 (Shukla et al.), N,N'-1,4,5,8-naphthalene tetracarboxylic acid diimides having fluoroalkyl-substituted cycloalkyl groups as described in U.S. Pat. No. 7,649,199 (Shukla et al.), heteropyrenes in p-type semiconductors as described in U.S. Pat. No. 7,781,076 (Shukla et al.), cyclohexyl-substituted naphthalene tetracarboxylic acid diimides as described in U.S. Pat. No. 7,804,087 (Shukla et al.), heterocyclyl-substituted naphthalene tetracarboxylic acid diimides as described in U.S. Pat. No. 7,858,970 (Shukla et al.), and N,N'-arylalkyl-substituted naphthalene-based tetracarboxylic acid diimides as described in U.S. Pat. No. 7,981,719 (Shukla et al.). The disclosures of all of the publications noted in this paragraph are incorporated herein by reference with respect to the noted semiconductor materials.

The present invention also provides integrated circuits that can comprise a plurality of OFET's prepared according to this invention.

The gate dielectric layers containing crosslinked disulfide polymer products described herein can be readily processed and are thermally and chemically stable to hot or cold organic solvents. The precursor dielectric compositions described herein can be deposited by spin coating, ink jetting, or blade coating, dried, and cured as described above to form gate dielectric layers. The entire process of making the thin film transistors or integrated circuits of the present invention can be carried out below a maximum support temperature of generally 450° C. or less, or typically at 250° C. or less, or even at 150° C. or less. The temperature selection generally depends on the substrate and processing parameters chosen for the given device, once a skilled artisan has the knowledge contained herein. These temperatures are well below traditional integrated circuit and semiconductor processing temperatures, which enables the use of any of a variety of relatively inexpensive substrates materials, such as flexible polymeric materials. Thus, the present invention enables the production of relatively inexpensive integrated circuits containing organic thin film transistors (OFET's) with significantly improved performance.

In one embodiment, an OFET structure illustrated in FIG. 1a is prepared by spin coating an organic semiconductor layer onto a gate dielectric layer prepared according to this invention, which has pre-patterned source and drain electrodes. In another embodiment, an OFET structure illustrated in FIG. 1c is prepared by spin coating an organic semiconductor layer onto the substrate with pre-patterned source and drain electrodes. Then, a precursor dielectric composition prepared according to this invention is spin coated onto the organic semiconductor layer followed by the deposition of the gate electrode by vacuum deposition or liquid deposition of a conductive metal or metal dispersion, respectively.

Electronic devices in which OFET's and other devices are useful include, for example, more complex circuits such as shift registers, integrated circuits, logic circuits, smart cards, memory devices, radio-frequency identification tags, backplanes for active matrix displays, active-matrix displays (for example liquid crystal or OLED), solar cells, ring oscillators, and complementary circuits, such as inverter circuits. In an active matrix display, a thin film transistor of the present invention can be used as part of voltage hold circuitry of a pixel of the display. In devices containing OFET's, the OFET's are operatively connected by means known in the art.

The present invention further provides a method of making any of the electronic devices described above. Thus, the present invention is embodied in an article that comprises one or more of the described thin film transistors. For example, electronic devices of this invention can be integrated circuits, active-matrix displays, and solar cells comprising a multiplicity of thin-film transistors. In some embodiments, the multiplicity of the thin-film transistors is on a non-participating support that is optionally flexible. The present invention also can be used to prepare an integrated circuit comprising a plurality of thin-film transistors.

The present invention provides at least the following embodiments and combinations thereof, but other combinations of features are considered to be within the present invention as a skilled artisan would appreciate from the teaching of this disclosure:

1. A device comprising a gate dielectric layer that comprises:

(1) a photochemically or thermally crosslinked product of a photocurable or thermally curable thiosulfate-containing polymer that has a $T_g$ of at least 50° C. and that comprises: an organic polymer backbone comprising (a) recurring units comprising pendant thiosulfate groups; and further comprises charge balancing cations, and (2) optionally, an electron-accepting photosensitizer component.

2. The device of embodiment 1, wherein the gate dielectric layer comprises a crosslinked disulfide polymer derived from the photocurable or thermally curable thiosulfate-containing polymer provided in a precursor dielectric composition further comprising one or more organic solvents in which the photocurable or thermally curable thiosulfate-containing polymer is dissolved or dispersed.

3. The device of embodiment 1 or 2, wherein the photochemically or thermally crosslinked product comprises less than 2 mol % of the original pendant thiosulfate groups that are not crosslinked.

4. The device of any of embodiments 1 to 3, wherein the charge balancing cations form binary salts with the pendant thiosulfate groups in the (a) recurring units that are represented by the following Structure (I):

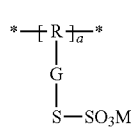

wherein R represents the organic polymer backbone, G is a single bond or a divalent linking group, M represents a charge balancing cation, and "a" represents at least 0.5 mol % and up to and including 100 mol % of (a) recurring units, based on the total recurring units in the photocurable or thermally curable thiosulfate-containing polymer.

5. The device of any of embodiments 1 to 4, wherein the charge balancing cations are part of the organic polymer backbone of the photocurable or thermally curable thiosulfate-containing polymer and are not part of pendant groups attached to the organic polymer backbone.

6. The device of any of embodiments 1 to 5, wherein the charge balancing cations form zwitterionic groups with the pendant thiosulfate groups in the (a) recurring units that are represented by the following Structure (II):

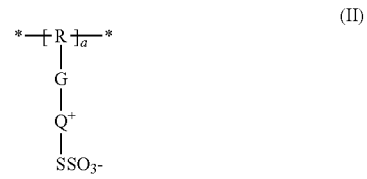

wherein R represents the organic polymer backbone, G is a single bond or divalent linking group, $Q^+$ is an organic charge balancing cation, and "a" represents at least 0.5 mol % and up to and including 100 mol % of (a) recurring units, based on the total recurring units in the photocurable or thermally curable thiosulfate-containing polymer.

7. The device of embodiment 6, wherein $Q^+$ is a quaternary ammonium cation, pyridinium cation, morpholinium cation, or thiazolium cation.

8. The device of any of embodiments 1 to 5, wherein the photocurable or thermally curable thiosulfate-containing polymer further comprises (b) recurring units that comprise the charge balancing cations, which photocurable or thermally curable thiosulfate-containing polymer is represented by the following Structure (III):

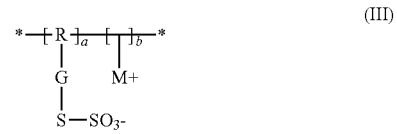

wherein R represents the organic polymer backbone, G is a single bond or a divalent linking group, $M^+$ represents a charge balancing cation, "a" represents at least 0.5 mol % and up to and including 50 mol % of (a) recurring units, and "b" represents (b) recurring units and is at least equal to the "a" mol %, based on the total recurring units in the photocurable or thermally curable thiosulfate-containing polymer.

9. The device of any of embodiments 1 to 8, wherein the photocurable or thermally curable thiosulfate-containing polymer further comprises:

(c) recurring units that are represented by the following Structure (IV);

(d) recurring units that are represented by the following Structure (V); or both (c) recurring units and (d) recurring units:

wherein R' represents the organic polymer backbone, G' is a single bond or a divalent linking group, $R_2$ is a electron-accepting photosensitizer component, and "c" represents at least 1 mol % and up to and including 10 mol % of (c) recurring units, based on the total recurring units in the photocurable or thermally-curable thiosulfate-containing polymer;

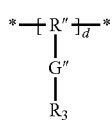   (V)

wherein R" represents the organic polymer backbone, G" is a carbonyloxy group, $R_3$ comprises a monovalent linear, branched, or carbocyclic non-aromatic hydrocarbon group having 1 to 18 carbon atoms, or it comprises a phenyl group that has one or more linear, branched, or carbocyclic non-aromatic hydrocarbon substituents, at least one of which linear, branched, or carbocyclic non-aromatic hydrocarbon substituents has at least 6 carbon atoms and up to and including 18 carbon atoms, and "d" represents at least 1 mol % and up to and including 40 mol % of (d) recurring units, based on the total recurring units in the photocurable or thermally-curable thiosulfate-containing polymer.

10. The device of any of embodiments 1 to 9, wherein the gate dielectric layer further comprises the electron-accepting photosensitizer component.

11. The device of any of embodiments 1 to 10, wherein the photocurable or thermally curable thiosulfate-containing polymer comprises the (a) recurring units in an amount of at least 0.5 mol % and up to and including 50 mol % of (a) recurring units, based on total recurring units in the photocurable or thermally curable thiosulfate-containing polymer.

12. The device of any of embodiments 1 to 11 further comprising an organic semiconductor layer that is in physical contact with the gate dielectric layer.

13. The device of any of embodiments 1 to 12 that is a thin film transistor that comprises a gate electrode, the gate dielectric layer, an organic semiconductor layer, and source and drain electrodes formed on a substrate that is glass substrate, silicon wafer, or a flexible polymeric film.

14. A method for preparing an electronic device of any of embodiments 1 to 13, comprising:
independently applying a precursor dielectric composition and an organic semiconductor composition to a substrate to form an applied precursor dielectric composition and an applied organic semiconductor composition, respectively, and
subjecting the applied precursor dielectric composition to curing conditions to form a gate dielectric layer comprising a photochemically cured or thermally cured product of a photocurable or thermally curable thiosulfate-containing polymer, which gate dielectric layer is in physical contact with the applied organic semiconductor composition,
wherein the precursor dielectric composition comprises:
(1) the photocurable or thermally curable thiosulfate-containing polymer that has a $T_g$ of at least 50° C. and that comprises: an organic polymer backbone comprising (a) recurring units comprising pendant thiosulfate groups; and charge balancing cations, (2) optionally, an electron-accepting photosensitizer component, and
(3) optionally, one or more organic solvents in which the photocurable or thermally curable thiosulfate polymer is dissolved or dispersed.

15. The method of embodiment 14 comprising, in order:
applying the precursor dielectric composition to the substrate to form the applied precursor dielectric composition,
removing any solvents from the applied precursor dielectric composition,
simultaneously or subsequently, curing the applied precursor dielectric composition to form a gate dielectric layer comprising a crosslinked disulfide polymer,
applying the organic semiconductor composition to the gate dielectric layer to form the applied organic semiconductor layer, and
forming one or more sets of electrically conductive source and drain electrodes on the applied organic semiconductor layer.

16. A process for fabricating a thin-film semiconductor device of any of embodiments 1 to 13, comprising:
providing a substrate,
providing a gate electrode material over the substrate,
providing a gate dielectric layer over the gate electrode material,
providing a thin film of an organic semiconductor material, and
providing a source electrode and a drain electrode contiguous to the thin-film of the organic semiconductor material,
wherein the dielectric gate layer comprises:
(1) a photochemically or thermally crosslinked product of a photocurable or thermally curable thiosulfate-containing polymer that has a $T_g$ of at least 50° C. and that comprises: an organic polymer backbone comprising (a) recurring units comprising pendant thiosulfate groups; and comprises charge balancing cations, and
(2) optionally, an electron-accepting photosensitizer component.

17. The method of embodiment 16, wherein the substrate is a flexible polymeric substrate.

18. The method of embodiment 16 or 17, wherein:
(A) the photocurable or thermally curable thio sulfate-containing polymer comprises:
(a) recurring units that are represented by the following Structure (I) or Structure (II), or both Structures (I) and (II):

   (I)

   (II)

wherein R represents the organic polymer backbone, G is a single bond or divalent linking group, $Q^+$ is an organic charge balancing cation, M represents a charge balancing cation, and "a" represents at least 0.5 mol % and up to and including 100 mol % of (a) recurring units, based on the total recurring units in the photocurable or thermally curable thiosulfate-containing polymer; or (B) the photocurable or thermally curable thiosulfate-containing polymer is represented by the following Structure (III):

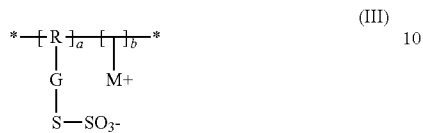

wherein R represents the organic polymer backbone, G is a single bond or a divalent linking group, M+ is a charge balancing cation, "a" represents at least 0.5 mol % and up to and including 50 mol % of (a) recurring units, and "b" represents the mol % of (b) recurring units and is at least equal to the "a" mol %, based on the total recurring units in the photocurable or thermally curable thiosulfate-containing polymer; and (C) wherein the photocurable or thermally curable thiosulfate-containing polymer of (A) or (B) optionally further comprises:

(c) recurring units that are represented by the following Structure (IV);

(d) recurring units that are represented by the following Structure (V); or both (c) recurring units and (d) recurring units:

wherein R' represents the organic polymer backbone, G' is a single bond or a divalent linking group, $R_2$ is a electron-accepting photosensitizer component, and "c" represents at least 1 mol % and up to and including 10 mol % of (c) recurring units, based on the total recurring units in the photocurable or thermally-curable thiosulfate-containing polymer;

wherein R" represents the organic polymer backbone, G" is a carbonyloxy group, $R_3$ comprises a monovalent linear, branched, or carbocyclic non-aromatic hydrocarbon group having 1 to 18 carbon atoms, or it comprises a phenyl group having one or more linear, branched, or carbocyclic non-aromatic hydrocarbon substituents, at least one of which linear, branched, or carbocyclic non-aromatic hydrocarbon substituents has at least 6 carbon atoms and up to and including 18 carbon atoms, and "d" represents at least 1 mol % and up to and including 40 mol % of (d) recurring units, based on the total recurring units in the photocurable or thermally-curable thiosulfate-containing polymer.

The following Examples are provided to illustrate the practice of this invention and are not meant to be limiting in any manner, and a number of materials were prepared as described below.

Synthesis 1

Preparation of Poly(Vinyl Benzyl Thiosulfate Sodium Salt-Co-Methyl Methacrylate)

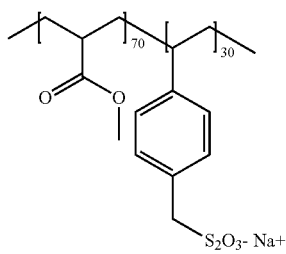

A representative photocurable or thermally curable thiosulfate-containing polymer useful in the practice of the present invention was prepared as follows:

Vinyl benzyl chloride (10 g, 0.066 mol), methyl methacrylate (26.23 g, 0.262 mol), and AIBN (1.08 g, 7 mmol) were dissolved 180 ml of toluene. The resulting reaction solution was purged with dry nitrogen and then heated at 65° C. overnight. After cooling the reaction solution to room temperature, it was dropwise added to 2000 ml of methanol. The resulting white powdery copolymer was collected by filtration and dried under vacuum at 60° C. overnight. 1H NMR analysis indicated that the resulting copolymer contained 30 mol % of recurring units derived from vinyl benzyl chloride.

A sample of this copolymer (18 g) was dissolved in 110 ml of N,N-dimethyl formamide (DMF). To this solution was added sodium thiosulfate (9 g) and 20 ml of water. Some copolymer precipitated out. The cloudy reaction mixture was heated at 70° C. for 24 hours. After cooling to room temperature, the hazy reaction mixture was transferred to a dialysis membrane and dialyzed against water. A small amount of the resulting copolymer solution was freeze dried for elemental analysis and the rest was stored for use as a solution. Elemental analysis indicated that all the benzyl chloride groups in the copolymer were converted to sodium thiosulfate salt to provide a photocurable or thermally-curable thiosulfate-containing polymer useful in the present invention.

Synthesis 2

Preparation of N-Butyl-N'-[2-(Ethoxy-2-Acrylate) Ethyl]-1,4,5,8-Naphthalenetetracarboxylic Diimide A representative ethylenically unsaturated polymerizable monomer useful to provide photocurable or thermally-curable thiosulfate-containing polymers of the present invention was prepared in the following manner.

Step 1

Synthesis of the Monopotassium Salt (Half Anhydride), 1-Potassium Carboxylate-8-Carboxylic Acid Naphthalene-4,5-Dicarboxylic Anhydride A 12-liter, four-neck round bottom flask fitted with a mechanical stirrer and a condenser was charged with potassium hydroxide (454 g, 7.60 mol) and water (6 liters), followed by the addition of 1,4,5,8-naphthalenetetracarboxylic dianhydride (462 g, 1.72 mol). The reaction mixture was stirred for 1 hour and a clear solution resulted. Phosphoric acid, 85% (613 g, 5.2 mol) in water (900 ml), was added over 45 minutes, the reaction solution was stirred overnight, and the resulting solid product was collected by filtration (yield close to 100%.) The spectral data were consistent with its assigned structure.

Step 2

Synthesis of Monoimide, Naphthalenetetracarboxylic-1,8-N-Butylimide-4,5-Anhydride A 12-liter, four-neck round bottom flask fitted with a mechanical stirrer and a condenser was charged with the monopotassium salt obtained in Step 1 (169.2 g, 0.52 mol) and water (5 liters) to give a milky brown-colored suspension. Butyl amine (240 g, 3.12 mol) was added all at once and a clear amber-colored solution was formed. The reaction solution was heated to 90-95° C. for 1 hour. Concentrated hydrochloric acid (690 ml) dissolved in 700 ml of water was added dropwise to the hot reaction solution and heating was continued for 2 hours. During the addition, the temperature did not exceed 95° C. Heat was removed and the reaction was allowed to stir overnight at room temperature. The resulting precipitate was collected on a glass frit to give 150 g of the desired product at 90% yield. Spectral data were consistent with the assigned compound structure.

Step 3

Synthesis of Diimide, N-Butyl-N'-[2-(2-Hydroxyethoxy)-Ethyl]-1,4,5,8-Naphthalenetetraccarboxylic Diimide A 12-liter, four-neck round bottom flask fitted with a mechanical stirrer and a condenser was charged with naphthalene butylimide monoanhydride (434 g, 1.4 mol) from Step 2, 2-(2-aminoethoxyethanol) (230 g, 2.2 mol), and N-methyl pyrrolidone (1.2 liters). The reaction solution was heated to 140-150° C. for 3 hours. The reaction solution was then allowed to cool for 30 minutes and the reaction flask was filled with methanol and a pink-colored solid precipitated. The reaction solution was stirred overnight and the resulting solid was collected on a glass frit to give 522 g of crude product (90% yield). Purification was carried out using dichloromethane on a silica gel column, providing 313 g of product (54% yield). The spectral data were consistent with the assigned compound structure.

Step 4

Coupling of Naphthalene Bisimide Alcohol with Acryloyl Chloride, N-Butyl-N'-[2-(Ethoxy-2-Acrylate) Ethyl]-1,4,5,8-Naphthalenetetracarboxylic Diimide with Acryloyl Chloride A 5-liter, four-neck round bottom flask fitted with a mechanical stirred, condenser and a nitrogen inlet was charged with the hydroxyl ether naphthalene butyl bisimide of Step 3 (246 g, 0.6 mol) and triethylamine (73 g, 0.72 mol, 100 ml) in dichloromethane (2 liters). Acryloyl chloride (63 g, 0.7 mol, 57 ml) in dichloromethane (DCM, 150 ml) was added dropwise, solubilizing the reactants and the reaction solution was stirred at room temperature overnight. The reaction solution was washed with 5% hydrochloride acid (200 ml), forming an emulsion. Methanol was added to break up the emulsion. The organic products were washed with water and dried over magnesium sulfate. The resulting product was purified on silica column using ligroin/DCM mixture at 1/1 then increasing to 100% DCM to elute the product. The spectral data were consistent with the assigned compound structure.

Synthesis 3

Preparation of 1,8-Naphthalimidohexyl Acrylate

A representative ethylenically unsaturated polymerizable monomer useful to provide thiosulfate polymers of the present invention was prepared as follows:

Step 1

Synthesis of 1,8-Naphthalimidohexanol (Diimide)

A 200 ml round bottom flask fitted with condenser, nitrogen inlet, and stirring magnet was charged with 1,8-naphthalic anhydride (10 g, 50.5 mmol), 6-amino-1-hexanol (6 g, 51.0 mmol), and 150 ml of N-methyl-2-pyrrolidone. The reaction mixture was warmed to 140° C. for 20 hours. The reaction mixture was then cooled and poured into excess ice water. A resulting brown precipitate was filtered and recrystalyzed from heptane to give 5 grams of a tan colored solid (30% yield). The spectral data were consistent with assigned compound structure.

Step 2

Synthesis of 1,8-Naphthalimidohexyl Acrylate

A 200 ml 3-neck round flask with a nitrogen inlet, and stirring magnet was charged with the 1,8-naphthalimidohexanol (2.1 g, 7.1 mmol) and 60 ml of anhydrous dichloromethane.

Once dissolved, triethylamine (0.9 g, 9.2 mmol) was added. To this stirring mixture was slowly added acryloyl chloride (0.8 g, 9.2 mmol). The reaction mixture was allowed to stir at room temperature for 24 hours. The reaction mixture was washed once with 10% HCl, then with water, and dried over magnesium sulfate, and the solvent was removed in vacuo to provide a yellow semisolid. The resulting crude product was purified by running it through column of silica with dichloromethane to elute the final product. The spectral data were consistent with the assigned compound structure.

Synthesis 4

Preparation of Poly(2-Hydroxy-2-Thiosulfate Sodium Salt Propyl Methacrylate-Co-Methyl Methacrylate)

The procedure of Synthesis 1 was followed using glycidyl methacrylate (18.2 g, 0.128 mol), methyl methacrylate (30.0 g, 0.300 mol), 2,2'-azobis(2-methylbutyronitrile) (0.82 g, 0.004 mol), and 192 ml of toluene. The reaction temperature was 70° C. 1H NMR analysis indicated that the resulting precursor polymer contained 35 mol % of recurring units derived from glycidyl methacrylate. Analysis by size exclusion chromatography (SEC) indicated a weight average molar mass of 45,800 (polystyrene standards)

The desired photocurable or thermally-curable thiosulfate-containing polymer was prepared as described for Synthesis 1 using 30.0 g of the precursor polymer, 140 ml of DMF, 16.8 g of sodium thiosulfate, and 28 ml of water. The temperature of the reaction solution was 70° C. for 24 hours. The glass transition temperature of the resulting photocurable or thermally-curable thiosulfate-containing polymer was determined to be 107.5° C. by Differential Scanning calorimetry (DSC).

Synthesis 5

Preparation of Poly(Vinyl Benzyl Thiosulfate Sodium Salt-Co-Methyl Methacrylate-Co-Octyl Methacrylate)

Vinyl benzyl chloride (5.00 g, 0.033 mol), methyl methacrylate (7.30 g, 0.073 mol), octyl methacrylate (0.793 g, 0.004 mole), and 2,2'-azobis(2-methylbutyronitrile) (0.20 g, 0.001 mol), were dissolved 52.0 ml of toluene. The resulting reaction solution was purged with dry nitrogen and then heated at 70° C. overnight. After cooling the reaction solution to room temperature, it was dropwise added to 2000 ml of methanol. The resulting white powdery precursor polymer was collected by filtration and dried under vacuum at 60° C. overnight. 1H NMR analysis indicated that the resulting copolymer contained 30 mol % of recurring units derived from vinyl benzyl chloride. Analysis by size exclusion chromatography (SEC) indicated a weight average molar mass of 35,200 (polystyrene standards).

The desired photocurable or thermally-curable thiosulfate-containing polymer was prepared as described for Synthesis 1 using 5.0 g of the precursor polymer, 23 ml of DMF, 2.8 g of sodium thiosulfate, and 5 ml of water. The temperature of the reaction solution was 70° C. for 24 hours. The glass transition temperature of the resulting photocurable or thermally-curable thiosulfate-containing polymer was determined to be 100.5° C. by Differential Scanning calorimetry (DSC).

Synthesis 6

Polyurethane with Thiosulfate Groups

Polycarbonate (5.40 g, 0.003 mol), 2,3 dibromo-1,4-butanediol (1.90 g, 0.008 mol), and a catalytic amount of dibutyltin dilaurate were dissolved 13 ml of tetrahydrofuran and warmed to 65° C. To this was added (under nitrogen) isophorone diisocyanate (2.5 g, 0.011 mol) dropwise. The reaction mixture was maintained at 70° C. for 20 hours, cooled and precipitated into heptanes. The resulting polymer was collected by filtration and dried under vacuum at 70° C. overnight. 1H NMR analysis indicated that the resulting precursor polymer contained 24 mol % of recurring units derived from dibromobutanediol. Analysis by size exclusion chromatography (SEC) indicated a weight average molar mass of 20,600 (polystyrene standards).

The desired photocurable or thermally-curable thiosulfate-containing polymer was prepared as described for Synthesis 1 using 3.0 g of the precursor polymer, 40 ml of DMF, 1.0 g of sodium thiosulfate, and 8 ml of water. The temperature of the reaction solution was maintained at 70° C. for 24 hours. The resulting thiosulfate-containing polyurethane is shown as follows with the three different types of recurring units.

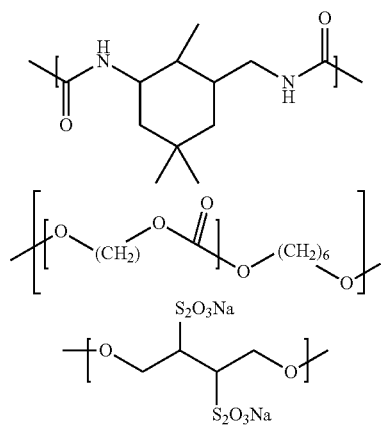

Inventive Example 1

Preparation of Poly(Vinyl Benzyl Thiosulfate Sodium Salt-Co-Methyl Methacrylate-Co-N-Butyl-N'-[2-(Ethoxy-2-Acrylate)Ethyl]-1,4,5,8-Naphthalenetetracarboxylic Diimide)

The procedure of Synthesis 1 was followed using vinyl benzyl chloride (4.2 g, 0.027 mol), methyl methacrylate (8.5 g, 0.085 mol), 1,8-naphthalimidohexanol (1.1 g, 0.002 mol), 2,2'-azobis(2-methylbutyronitrile) (0.33 g, 0.002 mol), and 47 ml of toluene. The reaction temperature was 70° C. 1H NMR analysis indicated that the resulting precursor polymer contained 30 mol % of recurring units derived from vinyl benzyl chloride. Analysis by size exclusion chromatography (SEC) indicated a weight average molar mass of 17,800 (polystyrene standards).

The desired photocurable or thermally curable thiosulfate-containing polymer was prepared as described in Synthesis 1 using 1.35 g of the precursor polymer, 50 ml of DMF, 1.5 g of sodium thiosulfate, and 10 ml of water. The temperature of the reaction solution was 90° C. for 8 hours. The glass transition temperature of the photocurable or thermally-curable thiosulfate-containing polymer was determined to be 99.8° C. by Differential Scanning calorimetry (DSC).

Inventive Example 2

Preparation of Poly(Vinyl Benzyl Thiosulfate Sodium Salt-Co-Methyl Methacrylate-Co-Acrylic Acid-Co-N-Butyl-N'-[2-(Ethoxy-2-Acrylate)Ethyl]-1,4,5,8-Naphthalenetetracarboxylic Diimide)

The procedure of Synthesis 1 was followed using vinyl benzyl chloride (8.2 g, 0.053 mol), methyl methacrylate (8.5 g, 0.085 mol), acrylic acid (8.5 g, 0.119 mol), 1,8-naphthalimidohexanol (2.3 g, 0.005 mol), 2,2'-azobis(2-methylbutyronitrile) (0.76 g, 0.004 mol), and 90 ml of dioxane. The reaction temperature was 70° C. $^1$H NMR analysis indicated that the resulting precursor polymer contained 30 mol % of recurring units derived from vinyl benzyl chloride. Analysis by size exclusion chromatography (SEC) indicated a weight average molar mass of 41,600 (polystyrene standards).

The desired photocurable or thermally-curable thiosulfate-containing polymer was prepared as described in Synthesis 1 using 26.1 g of the precursor polymer, 285 ml of DMF, 8.5 g sodium thiosulfate, and 57 ml of water. The temperature of the reaction solution was held at 90° C. for 8 hours. The glass transition temperature of the resulting photocurable or thermally-curable thiosulfate-containing polymer was determined to be 195° C. by Differential Scanning calorimetry (DSC).

Inventive Example 3

Preparation of Poly(Vinyl Benzyl Thiosulfate Sodium Salt-Co-Acrylic Acid-Co-N-Butyl-N'-[2-(Ethoxy-2-Acrylate) Ethyl]-1,4,5,8-Naphthalenetetracarboxylic Diimide)

The procedure of Synthesis 1 was followed using vinyl benzyl chloride (7.3 g, 0.048 mol), acrylic acid (15.0 g, 0.21 mol), 1,8-naphthalimidohexanol (1.9 g, 0.005 mol), 2,2'-azobis(2-methylbutyronitrile) (0.76 g, 0.004 mol), and 73 ml of dioxane. The reaction temperature was 70° C. 1H NMR analysis indicated that the resulting precursor polymer contained 31 mol % of recurring units derived from vinyl benzyl chloride. Analysis by size exclusion chromatography (SEC) indicated a weight average molar mass of 21,400 (polystyrene standards).

The desired photocurable or thermally-curable thiosulfate-containing polymer was prepared as described in Synthesis 1 using 20.0 g of the precursor polymer, 250 ml of DMF, 6.5 g sodium thiosulfate, and 50 ml of water. The reaction temperature was 90° C. for 8 hours to provide the desired photocurable or thermally-curable thiosulfate-containing polymer that had a glass transition temperature of 200° C. as determined by DSC.

Inventive Example 4

Preparation of Poly(Vinyl Benzyl Thiosulfate Sodium Salt-Co-Methyl Methacrylate-Co-1,8-Naphthalimidohexyl Acrylate)

The procedure of Synthesis 3 was followed using vinyl benzyl chloride (3.5 g, 0.023 mol), methyl methacrylate (7.7 g, 0.077 mol), 1,8-naphthalimidohexanol (0.5 g, 0.001 mol), 2,2'-azobis(2-methylbutyronitrile) (0.29 g, 0.002 mol), and 40 ml of toluene. 1H NMR analysis indicated that the desired precursor polymer contained 34 mol % of recurring units derived from vinyl benzyl chloride, and analysis by size exclusion chromatography (SEC) indicated a weight average molar mass of 25,800 (polystyrene standards).

The desired photocurable or thermally-curable thiosulfate-containing polymer was prepared as described in Synthesis 1 using 8.0 g of the precursor polymer, 40 ml of DMF, 3.9 g of sodium thiosulfate, and 8 ml of water. The reaction temperature was held at 90° C. for 8 hours to provide the desired photocurable or thermally-curable thiosulfate-containing polymer that had a glass transition temperature of 111° C. as measured by DSC.

Inventive Example 5

Preparation of Poly(Vinyl Benzyl Thiosulfate Sodium Salt-Co-Methyl Methacrylate-Co-Acrylic Acid-Co-1,8 Naphthalimidohexyl Acrylate)

The procedure of Synthesis 1 was followed using vinyl benzyl chloride (3.0 g, 0.02 mol), methyl methacrylate (3.6 g, 0.036 mol), acrylic acid (3.0 g, 0.04 mol), 1,8-naphthalimidohexanol (0.4 g, 0.001 mol), 2,2'-azobis(2-methylbuty-ronitrile) (0.28 g, 0.002 mol), and 30 ml of dioxane. 1H NMR analysis indicated that the resulting precursor polymer contained 33 mol % of vinyl benzyl chloride, and analysis by SEC indicated a weight average molar mass of 45,200 (polystyrene standards).

The desired photocurable or thermally-curable thiosulfate-containing polymer was prepared as described in Synthesis 3 using 4.2 g of the precursor polymer, 22.5 ml of DMF, 2.1 g of sodium thiosulfate, and 4.5 ml of water. The reaction temperature was held at 90° C. to provide the desired photocurable or thermally-curable thiosulfate-containing polymer that had a glass transition temperature of 119° C. as determined by DSC.

Preparation of Gate Dielectric Layer and Dielectric Constant Measurement

Invention Example 6

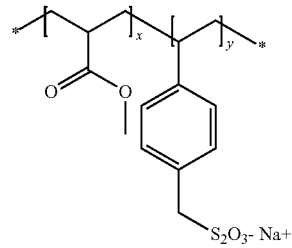

A 7 weight % water solution of a photocurable or thermally-curable thiosulfate-containing polymer, poly(vinyl benzyl thiosulfate sodium salt-co-methyl methacrylate) (structure shown above; synthesis described in Invention Example 1) was filtered through a Whatman 0.45 μm glass microfiber filter into a clean glass vial or container. A filtered precursor dielectric composition containing this polymer was spun cast onto a heavily doped silicon wafer substrate for 10 seconds at 1100 rpm and the coating speed was increased over 30 seconds to 3,000 rpm and spun at this speed for 40 seconds. To provide thermal curing, the coated dielectric composition film was then placed on a hot plate and gradually heated from 50° C. to 140° C. over a period of 15 minutes. Finally, the temperature was increased to 150° C. and was held there for 30 minutes. The resulting dry gate dielectric layer containing crosslinked polymer was gradually cooled to room temperature over a period of 30 minutes. Its dry thickness was in the range of from 350 nm to 400 nm.

The capacitance of the resulting gate dielectric layer was measured with an impedance analyzer (Hewlett Packard 4192A) at a frequency of 10 kHz. Each substrate was a heavily doped Si wafer. Silver layers with an area of approximately $5 \times 10^{-7}$ m$^2$ and patterned as upper electrodes on the surface of each composite structure were deposited in vacuum through a shadow mask. The dielectric constant of the composite structure was estimated from the capacitance of the gate dielectric layer, the area of the silver upper electrode, and the gate dielectric layer thickness.

The dielectric constant of the thermally crosslinked poly (vinyl benzyl thiosulfate sodium salt-co-methyl methacrylate)-containing gate dielectric layer is shown below in TABLE I.

Invention Example 7

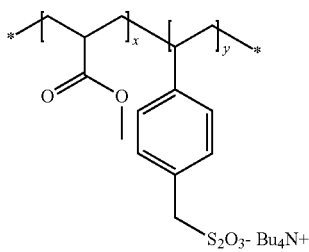

To a water solution of a photocurable or thermally-curable thiosulfate-containing polymer, poly(vinyl benzyl thiosulfate sodium salt-co-methyl methacrylate), a stoichiometric amount of tetrabutylammonium chloride was added and solution stirred for 10-20 minutes. An aqueous solution of the resulting polymer was transferred into a separatory funnel and extracted with methylene chloride. Combined methylene chloride extracts were dried over anhydrous MgSO4, filtered, and evaporated to obtain a white powder of poly(vinyl benzyl thiosulfate tetrabutylammonium salt-co-methyl methacrylate).

A 6 weight % solution of poly(vinyl benzyl thiosulfate tetrabutylammonium salt-co-methyl methacrylate) in methylene chloride and 1-methoxy-2-isopropanol (3:1 v/v) was spin coated as a precursor dielectric composition onto a doped silicon wafer as a substrate. The coated dielectric composition was then placed onto a hot plate and gradually heated from 50° C. to 140° C. over a period of 15 minutes. Finally, the temperature was increased to 150° C. and was held for 30 minutes. The thermally cured gate dielectric layer was gradually cooled to room temperature over a period of 30 minutes. The thickness of the gate dielectric layer was in the range of from 350 nm to 400 nm.

The capacitance of the gate dielectric layer was measured with an impedance analyzer (Hewlett Packard 4192A) at a frequency of 10 kHz. The substrate was a heavily doped Si wafer. Silver layers with an area of approximately $5\times10^{-7}$ m$^2$ as upper electrodes were patterned on the surface of each composite were deposited in vacuum through a shadow mask. The dielectric constant of the composite film was estimated from the capacitance of the gate dielectric layer, area of the silver electrode, and gate dielectric layer thickness.

The dielectric constant of the gate dielectric layer is shown below in TABLE I.

TABLE I

| Invention Polymer | x | y | Dielectric constant (k) @ 10 kHz |
|---|---|---|---|
| [structure: poly(vinyl benzyl thiosulfate Bu4N+ salt-co-methyl methacrylate)] | 0.67 | 0.33 | 4.1 (+/− 0.1) |
| | 0.86 | 0.14 | 3.6 (+/− 0.1) |
| | 0.92 | 0.08 | 3.1 (+/− 0.1) |

TABLE I-continued

| Invention Polymer | x | y | Dielectric constant (k) @ 10 kHz |
|---|---|---|---|
| [structure: poly(vinyl benzyl thiosulfate Bu4N+ salt-co-methyl methacrylate)] | 0.67 | 0.33 | 4.1 (+/− 0.1) |

The following examples demonstrate that organic thin film transistor devices comprising photocrosslinked polymers derived from photocurable or thermally-curable thiosulfate-containing polymers in gate dielectric layers according to the present invention exhibited high mobilities and on/off ratios.

Organic Thin Film Transistor Device Preparation:

In order to test the electrical characteristics of the various gate dielectric layers according to the present invention, organic field-effect transistors were made using the top-contact geometry as illustrated in FIGS. 1c and 1d. The substrate used was a heavily doped silicon wafer that also served as the gate of each transistor. The gate dielectric layers were obtained from photocurable or thermally-curable thiosulfate-containing polymers in precursor dielectric compositions spun coated onto the substrate to have a dry thickness of 300-400 nm.

Device Measurement and Analysis

Electrical characterization of the fabricated electronic devices was performed using a Hewlett Packard HP 4145B® parameter analyzer. The probe measurement station was held in a positive argon environment for all measurements with the exception of those purposely used to test the stability of the devices in air. The measurements were performed under sulfur lighting unless sensitivity to white light was being investigated. The electronic devices were exposed to air prior to testing.

For each experiment performed, between 4 and 12 individual electronic devices were tested using each prepared organic semiconductor layer, and the results were averaged. For each electronic device, the drain current ($I_d$) was measured as a function of source-drain voltage ($V_d$) for various values of gate voltage ($V_g$). For most electronic devices, $V_d$ was swept from 0 V to 80 V for each of the gate voltages measured, typically 0 V, 20 V, 40 V, 60 V, and 80 V. In these measurements, the gate current ($I_g$) was also recorded in order to detect any leakage current through the device. Furthermore, for each device the drain current was measured as a function of gate voltage for various values of source-drain voltage. For most devices, $V_g$ was swept from 0 V to 80 V for each of the drain voltages measured, typically 40 V, 60 V, and 80 V.

Parameters extracted from the data include field-effect mobility ($\mu$), threshold voltage ($V_t$), sub-threshold slope (S), and the ratio of $I_{on}/I_{off}$ for the measured drain current. The field-effect mobility was extracted in the saturation region, where $V_d > V_g - V_t$. In this region, the drain current is given by the equation [see Sze, *Semiconductor Devices—Physics and Technology*, John Wiley & Sons (1981)]:

$$I_d = \frac{WC_0}{2L}\mu(V_g - V_t)^2$$

$$\sqrt{I_d} = \sqrt{\frac{\mu C_0 W}{2L}}(V_g - V_t)$$

-continued $$\text{slope} = \sqrt{\frac{\mu C_0 W}{2L}}$$

$$\mu = (\text{slope})^2 \frac{2L}{C_0 W}$$

wherein W and L are the channel width and length, respectively, and $C_o$ is the capacitance of the oxide layer, which is a function of oxide thickness and dielectric constant of the material. Given this equation, the saturation field-effect mobility was extracted from a straight-line fit to the linear portion of the $\sqrt{I_d}$ versus $V_g$ curve (as described above). The threshold voltage, $V_t$, is the x-intercept of this straight-line fit. Mobilities can also be extracted from the linear region, where $V_d \leq V_g - V_t$. The drain current is given by the following equation (see Sze, noted above):

$$I_d = \frac{W}{L}\mu C_0\left[V_d(V_g - V_t) - \frac{V_d^2}{2}\right]$$

For these experiments, mobilities in the linear regime were not extracted, since this parameter is very much affected by any injection problems at the contacts. In general, non-linearity in the curves of $I_d$ versus $V_d$ at low $V_d$ indicates that the performance of the device is limited by injection of charge by the contacts. In order to obtain results that are largely independent of contact imperfections of a given device, the saturation mobility rather than the linear mobility was extracted as the characteristic parameter of device performance.

The log of the drain current as a function of gate voltage was plotted. Parameters extracted from the log $I_d$ plot include the $I_{on}/I_{off}$ ratio and the sub-threshold slope (S). The $I_{on}/I_{off}$ ratio is simply the ratio of the maximum to minimum drain current, and S is the inverse of the slope of the $I_d$ curve in the region over which the drain current is increasing (that is, the device is turning on).

Organic Semiconductors:

n-Type organic semiconductors A-1 and A-2 that were used to fabricate OFET devices in comparative and inventive examples have been previously described in U.S. Pat. No. 7,422,777 (Shukla et al.) and U.S. Pat. No. 7,804,087 (Shukla et al.). Compounds A-1 and A-2 (shown below) were prepared and purified following procedures described in these two patents and these preparations are incorporated herein by reference.

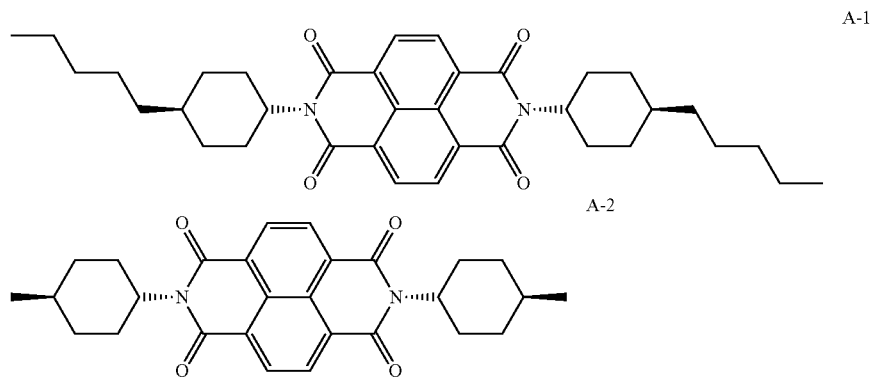

Invention Example 8

Thiosulfate containing polymer (x=0.67; y=0.33) described in above Invention Example 6 of the present invention was coated onto Si wafers as and thermally cured as described in Invention Example 7. A 0.3 weight % solution of organic semiconductor, A-1 (shown above and as disclosed in U.S. Pat. No. 7,804,087 of Shukla et al. the disclosure of which is incorporated herein by reference) in a mixture of mesitylene and 1,2,4-trimethylbenzene (1:3 v/v) was spin coated onto the dry gate dielectric layer at 800 rpm and dried at 70° C. for 15 minutes. Silver contacts having a thickness of 50 nm were then deposited through a shadow mask. The channel width was held at 1000 µm while the channel lengths were varied between 50 µm and 150 µm. For each thin film transistor, the field effect mobility, µ, was calculated from the slope of the $(I_d)^{1/2}$ versus $V_G$ plot. The average mobility was found to be 0.014 cm²/V·sec in the saturation region, the average on-off ratio was 3×10³, and the average threshold voltage was 70 V. Saturation mobilities of up to and including 0.02 cm²/V·sec were measured for these devices.

In a different experiment, organic semiconductor A-2 (shown above) was deposited by vacuum deposition in a thermal evaporator. The deposition rate was 0.1 Angstroms per second while the substrate temperature was held at 25° C. for most experiments. The thickness of the resulting organic semiconductor layer was a variable in some experiments but was typically 25 nm. The average mobility in devices with A-2 semiconductor was found to be 0.7 cm²V·sec in the saturation region, the average on-off ratio was 3×10⁵, and the average threshold voltage was 43 V. Saturation mobilities of up to and including 1.0 cm²/V·sec were measured for these devices.

The invention has been described in detail with particular reference to certain desirable embodiments thereof, but it will be understood that variations and modifications can be effected within the spirit and scope of the invention.

PARTS LIST

10 Substrate
20 Gate dielectric layer
30 Semiconductive organic layer
40 Source electrode
50 Drain electrode
60 Gate electrode

The invention claimed is:

1. A method for preparing an electronic device comprising:
   independently applying a precursor dielectric composition and an organic semiconductor composition to a substrate to form an applied precursor dielectric composition and an applied organic semiconductor composition, respectively, and
   subjecting the applied precursor dielectric composition to curing conditions to form a gate dielectric layer comprising a photochemically cured or thermally cured product of a photocurable or thermally curable thiosulfate-containing polymer, which gate dielectric layer is in physical contact with the applied organic semiconductor composition,
   wherein the precursor dielectric composition comprises:
   (1) the photocurable or thermally curable thiosulfate-containing polymer that has a $T_g$ of at least 50° C. and that comprises: an organic polymer backbone that comprises at least one repeating unit comprising (a) recurring units comprising pendant thiosulfate groups; and the photocurable or thermally curable thiosulfate-containing polymers further comprises, either within the (a) recurring units or within recurring units different from the (a) recurring units, charge balancing cations,
   wherein the photocurable thiosulfate-containing polymer has sensitivity to irradiation at a wavelength of from 150 nm to 700 nm to cause the pendant thiosulfate groups to form disulfide bonds;
   (2) optionally, an electron-accepting photosensitizer component; and
   (3) optionally, one or more organic solvents in which the photocurable or thermally curable thiosulfate polymer is dissolved or dispersed.

2. The method of claim 1 comprising, in order:
   applying the precursor dielectric composition to the substrate to form the applied precursor dielectric composition,
   removing any solvents from the applied precursor dielectric composition,
   simultaneously or subsequently, curing the applied precursor dielectric composition to form a gate dielectric layer comprising a crosslinked disulfide polymer,
   applying the organic semiconductor composition to the gate dielectric layer to form the applied organic semiconductor layer, and
   forming one or more sets of electrically conductive source and drain electrodes on the applied organic semiconductor layer.

3. The method of claim 1, wherein the precursor dielectric composition further comprises one or more organic solvents in which the photocurable or thermally curable thiosulfate-containing polymer is dissolved or dispersed.

4. The method of claim 1, wherein the charge balancing cations are within the (a) recurring units and form binary salts with the pendant thiosulfate groups in the (a) recurring units that are represented by the following structure (I):

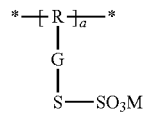

wherein R represents the organic polymer backbone, G is a single bond or a divalent linking group, M represents a charge balancing cation, and "a" represents at least 0.5 mol % and up to and including 100 mol % of (a) recurring units, based on the total recurring units in the photocurable or thermally curable thiosulfate-containing polymer.

5. The method of claim 1, wherein the charge balancing cations are part of the organic polymer backbone of the photocurable or thermally curable thiosulfate-containing polymer and are not part of pendant groups attached to the organic polymer backbone.

6. The method of claim 1, wherein the charge balancing cations are within the (a) recurring units and form zwitterionic groups with the pendant thiosulfate groups in the (a) recurring units that are represented by the following structure (II):

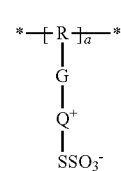

wherein R represents the organic polymer backbone, G is a single bond or divalent linking group, $Q^+$ is an organic charge balancing cation, and "a" represents at least 0.5 mol % and up to and including 100 mol % of (a) recurring units, based on the total recurring units in the photocurable or thermally curable thiosulfate-containing polymer.

7. The method of claim 6, wherein $Q^+$ is a quaternary ammonium cation, pyridinium cation, morpholinium cation, or thiazolium cation.

8. The method of claim 1, wherein the photocurable or thermally curable thiosulfate-containing polymer further comprises (b) recurring units that comprise the charge balancing cations, which photocurable or thermally curable thiosulfate-containing polymer is represented by the following structure (III):

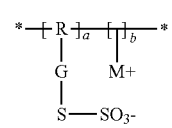

wherein R represents the organic polymer backbone, G is a single bond or a divalent linking group, $M^+$ represents a charge balancing cation, "a" represents at least 0.5 mol % and up to and including 50 mol % of (a) recurring units, and "b" represents (b) recurring units and is at least equal to the "a" mol %, based on the total recurring units in the photocurable or thermally curable thiosulfate-containing polymer.

9. The method of claim 1, wherein the photocurable or thermally curable thiosulfate-containing polymer further comprises:

(c) recurring units that are represented by the following structure (IV);
(d) recurring units that are represented by the following structure (V); or both (c) recurring units and (d) recurring units:

wherein R' represents the organic polymer backbone, G' is a single bond or a divalent linking group, R₂ is a electron-accepting photosensitizer component, and "c" represents at least 1 mol % and up to and including 10 mol % of (c) recurring units, based on the total recurring units in the photocurable or thermally curable thiosulfate-containing polymer;

wherein R" represents the organic polymer backbone, G" is a carbonyloxy group, R₃ comprises a monovalent linear, branched, or carbocyclic non-aromatic hydrocarbon group having 1 to 18 carbon atoms, or it comprises a phenyl group that has one or more linear, branched, or carbocyclic non-aromatic hydrocarbon substituents, at least one of which linear, branched, or carbocyclic non-aromatic hydrocarbon substituents has at least 6 carbon atoms and up to and including 18 carbon atoms, and "d" represents at least 1 mol % and up to and including 40 mol % of (d) recurring units, based on the total recurring units in the photocurable or thermally curable thiosulfate-containing polymer.

10. The method of claim 1, wherein the precursor dielectric composition further comprises the electron-accepting photosensitizer component.

11. The method of claim 1, wherein the photocurable or thermally curable thiosulfate-containing polymer comprises the (a) recurring units in an amount of at least 0.5 mol % and up to and including 50 mol %, based on total recurring units in the photocurable or thermally curable thiosulfate-containing polymer.

12. The method of claim 1, further providing a gate electrode, and source and drain electrodes on the substrate that is glass substrate, silicon wafer, or a flexible polymeric film.

13. The method of claim 1, wherein the precursor dielectric composition comprises a photocurable thiosulfate-containing polymer that has a sensitivity to irradiation at a wavelength of at least 150 nm and up to and including 450 nm to cause the pendant thiosulfate groups to form disulfide bonds.

14. The method of claim 1, wherein the photocurable or thermally curable thiosulfate-containing polymer is present in the gate dielectric layer in an amount of at least 90 weight % and up to and including 100 weight %, based on the total dry weight of the gate dielectric layer.

15. The method of claim 1, wherein the substrate is a flexible substrate and the method is carried out in a roll-to-roll manufacturing operation.

16. The method of claim 1, wherein the substrate is combined with a temporary support that is detachable adhered or mechanically affixed to the substrate.

17. A process for fabricating a thin-film semiconductor device, comprising:
providing a substrate,
providing a gate electrode material over the substrate,
providing a gate dielectric layer over the gate electrode material,
providing a thin film of an organic semiconductor material, and
providing a source electrode and a drain electrode contiguous to the thin-film of the organic semiconductor material,
wherein the dielectric gate layer comprises:
(1) a photochemically or thermally crosslinked product of a photocurable or thermally curable thiosulfate-containing polymer that has a T_g of at least 50° C. and that comprises: an organic polymer backbone that comprises at least one recurring unit comprising:
(a) recurring units comprising pendant thiosulfate groups; and the photocurable or thermally curable thiosulfate-containing polymer further comprises, either within the (a) recurring units or within recurring units different from the (a) recurring units, charge balancing cations,
wherein the photocurable thiosulfate-containing polymer has sensitivity to irradiation to a wavelength of from 150 nm to 700 nm to cause the pendant thiosulfate groups to form disulfide bonds; and
(2) optionally, an electron-accepting photosensitizer component.

18. The process of claim 17, wherein the substrate is a flexible polymeric substrate.

19. The method of claim 17, wherein:
(A) the photocurable or thermally curable thiosulfate-containing polymer comprises:
(a) recurring units that are represented by the following structure (I) or structure (II), or both structures (I) and (II):

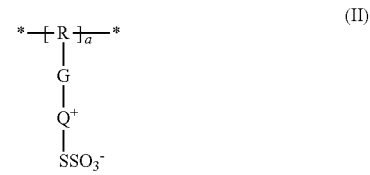

wherein R represents the organic polymer backbone, G is a single bond or divalent linking group, Q⁺ is an organic charge balancing cation, M represents a charge balancing cation, and "a" represents at least 0.5 mol % and up to and including 100 mol % of (a) recurring units, based on the total recurring units in the photocurable or thermally curable thiosulfate-containing polymer; or (B) the photocurable or thermally curable thiosulfate-containing polymer is represented by the following structure (III):

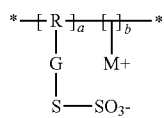
(III)

wherein R represents the organic polymer backbone, G is a single bond or a divalent linking group, $M^+$ is a charge balancing cation, "a" represents at least 0.5 mol % and up to and including 50 mol % of (a) recurring units, and "b" represents the mol % of (b) recurring units and is at least equal to the "a" mol %, based on the total recurring units in the photocurable or thermally curable thiosulfate-containing polymer; and (C) wherein the photocurable or thermally curable thiosulfate-containing polymer of (A) or (B) optionally further comprises:
(c) recurring units that are represented by the following structure (IV);
(d) recurring units that are represented by the following structure (V); or
both (c) recurring units and (d) recurring units:

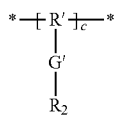
(IV)

wherein R' represents the organic polymer backbone, G' is a single bond or a divalent linking group, $R_2$ is a electron-accepting photosensitizer component, and "c" represents at least 1 mol % and up to and including 10 mol % of (c) recurring units, based on the total recurring units in the photocurable or thermally-curable thiosulfate-containing polymer;

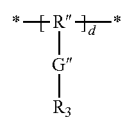
(V)

wherein R" represents the organic polymer backbone, G" is a carbonyloxy group, $R_3$ comprises a monovalent linear, branched, or carbocyclic non-aromatic hydrocarbon group having 1 to 18 carbon atoms, or it comprises a phenyl group having one or more linear, branched, or carbocyclic non-aromatic hydrocarbon substituents, at least one of which linear, branched, or carbocyclic non-aromatic hydrocarbon substituents has at least 6 carbon atoms and up to and including 18 carbon atoms, and "d" represents at least 1 mol % and up to and including 40 mol % of (d) recurring units, based on the total recurring units in the photocurable or thermally-curable thiosulfate-containing polymer.

* * * * *